(12) United States Patent
Kim et al.

(10) Patent No.: US 7,900,111 B1
(45) Date of Patent: Mar. 1, 2011

(54) METHOD AND APPARATUS FOR RANDOM STIMULUS GENERATION

(75) Inventors: Won Sub Kim, Fremont, CA (US); Mary Lynn Meyer, Mountain View, CA (US); Daniel Marcos Chapiro, Palo Alto, CA (US)

(73) Assignee: Synopsys, Inc., Mountain View, CA (US)

( * ) Notice: Subject to any disclaimer, the term of this patent is extended or adjusted under 35 U.S.C. 154(b) by 1443 days.

(21) Appl. No.: 10/420,443

(22) Filed: Apr. 21, 2003

Related U.S. Application Data

(63) Continuation of application No. 09/344,148, filed on Jun. 24, 1999, now Pat. No. 6,533,531, which is a continuation-in-part of application No. 09/298,981, filed on Apr. 22, 1999, now Pat. No. 6,449,745, and a continuation-in-part of application No. 09/298,986, filed on Apr. 22, 1999, now Pat. No. 6,499,127, and a continuation-in-part of application No. 09/298,984, filed on Apr. 22, 1999, now Pat. No. 6,513,144.

(51) Int. Cl.
*G01R 31/28* (2006.01)
*G06F 11/00* (2006.01)

(52) U.S. Cl. .................. 714/739; 714/728
(58) Field of Classification Search .......... 714/728, 714/739; 707/103
See application file for complete search history.

(56) References Cited

U.S. PATENT DOCUMENTS 6,076,083 A * 6/2000 Baker .................. 706/52

OTHER PUBLICATIONS

Mark R. Headington and David D. Riley, "Data Abstraction and Structures Using C++", D. C. Heath and Company, 1994.*

Random.java, Copyright 1995-1998 by Sun Microsystems, Inc.+.*
Create a new instance of the receiver with D. Knuth's constants. (c) Copyrights Didier BESSET, 1999.*
Random number generator class From: David N. Smith Date: Aug. 17, 1997.*
Joines et al., Fundamentals of Object-Oriented Simulation, Proceedings of the 1998 Winter Simulation Conference.*
Coddington et al., Interfaces and Implementations of Random Number Generators for Java Grande Applications, Feb. 15, 1999.*
"Structure and Interpretation of Computer programs" by H. Abelson, G.J. Sussman and J. Sussman, 1986, The MIT Press, Massachusetts Institute of Technology, pp. vii-x, 20-21, 168-170, 230-232, 335-362.

* cited by examiner

*Primary Examiner*—Joseph D Torres
(74) *Attorney, Agent, or Firm*—Park, Vaughan, Fleming & Dowler LLP

(57) ABSTRACT

Capabilities are added to a Hardware Verification Language that facilitates the generation of test data. Random number sources, called random variables, can be produced by adding a randomness attribute to a variable declaration of a class definition. A "randomize" method call to a class instance produces a random value for each random variable. Constraint blocks, of a class definition, control random variables with constraint expressions. Dependency, of random variable value assignment, as determined by constraint expressions, can be expressed by a DAG. A constraint expression is converted into ranges of permissible values, from which a value is randomly chosen by a randomize method. A "boundary" method call sequentially selects a combination of boundary values, for each random variable, from each random variable's set of ranges. Coordinated selection of a boundary values permits all combinations of boundary values to be produced through successive boundary calls.

7 Claims, 67 Drawing Sheets

DAG Node Contents:

rvar_pointer /* points to random variable in an HLevel_record which this DAG node represents */ do_randomize /* indicates that random variable, represented by the DAG node, should be assigned a random value */ relop_start_addr_list /* pointer to list of relop/start_addr pairs for each constraint_expression which the random variable, represented by the DAG node, appears on the lhs of */ set_constraint_field /* calculated from relop/start_addr pairs; expresses all the valid ranges from which the random variable, represented by the DAG node, can be assigned a randomly chosen value */ curr_boundary_value_index /* Used by boundary. Indicates how many of the unique boundary values of the set_constraint_field have been used by the current sequence of boundary combinations. */ depends_on_list /* pointer to linked list of pointers which point to the DAG nodes this node's random variable depends on */ ordering_number /* the higher this number is, the more random variables depend on it. used by linearize_dag to order DAG nodes */ next_dag_node /* pointer to later DAG node in linear ordering */ previous_dag_node /* pointer to earlier DAG node in linear ordering */

Class Definition:

class <class name> [ extends <parent class> ]
{
<variable declarations>

<constraint blocks>

<methods>
}

FIG. 1

Random Variable Declaration:

rand <variable specification>;

randc <variable specification>;

FIG. 2

Associative Array Declaration:

<rand or randc>
<data type of array's elements>
<array name>[ ] assoc_size
<expression for # of elements to be randomized>
;

FIG. 3

Generation Methods:

<instance>.randomize()

<instance>.rand_mode(
    <ON/OFF> [ , <variable specification> ] )

<instance>.rand_mode(
    <REPORT> , <variable specification> )

<instance>.boundary(<FIRST/NEXT>)

FIG. 4

Constraint Block Definition:

constraint <constraint block name>
{
<constraint_expressions>
}

FIG. 5

Constraint Expression:

<lhs random variable> <relational operator> <rhs expression>;

FIG. 6

Constraint Methods:

<instance>.constraint_mode(
    <ON/OFF> [ , <constraint block specification> ] )

<instance>.constraint_mode(
    REPORT , <constraint block name> )

FIG. 7

HLevel_record Contents:

DAG /* pointer to DAG, only used for top-level HLevel_record */

<data storage for each variable declared by Vera language programmer, including handles to each instance of another user-defined class instantiated as a variable by Vera language programmer>

<rand_flag for each random variable declared by Vera language programmer>

<rtable for each non-array randc random variable declared by Vera language programmer>

<rtable for each element of regular randc array declared by Vera language programmer>

<rand_assoc_array flag to indicate each associative randc array declared by Vera language programmer> num_rvars /* The number of random variables in HLevel_record */ ptr_to_all_rvar_ptrs /* Points to an array of pointers. Each pointer points to a random variable of HLevel_record */

<hidden_var for each constraint block> constraint_block_list

FIG. 9

Constraint_block Contents:

cons_block_name hidden_var_ptr /* Points to hidden_var in HLevel_record for this constraint_block */ num_constraints /* number of constraints in this constraint_block */ cons_table_ptr /* Points to array of one_constraint records for this constraint_block */

FIG. 10

One_constraint Contents:

lhs /* Pointer to random variable for lhs of this one_constraint. Random variable may be in HLevel_record directly associated with one_constraint, or in an ancestor HLevel_record. */ relop num_rhs_vars /* Number of random variables on rhs of this one_constraint */ rhs_vars /* Pointer to an array of pointers. Each points to a location in an HLevel_record for a random variable on the rhs of this one_constraint. The HLevel_record may be one with which one_constraint is directly associated, or in any ancestor. */ start_addr /* Start address for execution of Vera assembly code which evaluates rhs of one_constraint */

FIG. 11

Associative Array Constraint_block Contents:

cons_block_name = "assoc_size"

hidden_var_ptr = NULL /* Since always ON */ num_constraints = <number of associative arrays in this HLevel_record> cons_table_ptr = <pointer to an array with one one_constraint record for each associative array in this HLevel_record>

FIG. 12

Associative Array One_Constraint Contents:

lhs = <pointer to the data storage region of the appropriate HLevel_record for maintaining the entire associative array> relop = "ASSOC_SIZE"

num_rhs_vars = <number of random variables in expression which determines number of elements to be randomized> rhs_vars = <pointer to an array of pointers, where each pointer in array points to a random variable in the expression which determines the number of elements to be randomized> start_addr = <start address for Vera assembly code which determines the number of elements to be randomized>

FIG. 13

DAG Node Contents:

rvar_pointer /* points to random variable in an HLevel_record which this DAG node represents */ do_randomize /* indicates that random variable, represented by the DAG node, should be assigned a random value */ relop_start_addr_list /* pointer to list of relop/start_addr pairs for each constraint_expression which the random variable, represented by the DAG node, appears on the lhs of */ set_constraint_field /* calculated from relop/start_addr pairs; expresses all the valid ranges from which the random variable, represented by the DAG node, can be assigned a randomly chosen value */ curr_boundary_value_index /* Used by boundary. Indicates how many of the unique boundary values of the set_constraint_field have been used by the current sequence of boundary combinations. */ depends_on_list /* pointer to linked list of pointers which point to the DAG nodes this node's random variable depends on */ ordering_number /* the higher this number is, the more random variables depend on it. used by linearize_dag to order DAG nodes */ next_dag_node /* pointer to later DAG node in linear ordering */ previous_dag_node /* pointer to earlier DAG node in linear ordering */

FIG. 14

Set Constraint Contents:

Array of ranges, where each each range is a tuple containing:

low_end /* low end of range */ high_end /* high end of range */ apportion_op /* apportionment operator */ weight /* weight applied by apportionment operator */ sub_ranges /* Pointer to linked list of sub_ranges this range may be split into */ num_values /* number of valid values represented by this range */

```
1    randomize (do_it = 1)
2    /* SUMMARY: Let <instance> represent the handle of an instance and let the
3    method call to "randomize" for <instance> be of the form
4    "<instance>.randomize()." The result of such a method call is to assign
5    appropriate random values to all the ON random variables (whether a built-in data
6    type of Vera or a sub-object) at each level of <instance>'s hierarchy. The random
7    value given to each variable that is a built-in data type must satisfy all ON
8    constraints, where the constraint's level in the class hierarchy of <instance> is
9    equal to or lower than the constrained variable's level. Similarly, the random
10   values are given within the sub-objects to its built-in data types: values are
11   assigned to ON random variables and the values must satisfy all ON constraints,
12   where the constraint's level in the class hierarchy, from which the sub-object is
13   composed, is lower than or equal to the constrained variable's level. Essentially,
14   sub-objects "take care of themselves" by being given their own "randomize"
15   method call which does a randomizing process independent of <instance>'s. This
16   permits randomize to operate recursively, in the cases where the sub-objects
17   themselves have sub-objects.
18
19   The user's call to <instance>'s randomize method, of the form
20   "<instance>.randomize ()," has the "do_it" parameter set to the default value of 1
21   and begins with the semantics as viewed from the lowest level of the class
22   hierarchy. This semantic level means that if any constraint blocks at a lower level
23   of the hierarchy use the same name as a constraint block at a higher level of the
24   hierarchy, the lowest level definition under that name completely determines the
25   meaning of that name.
26
27   "rvar" in the pseudo-code of all the Appendices is an abbreviation for "random
28   variable." */
29   {
30   /* set default value to be returned by randomize() as OK */
31   success = OK;
32
33   /* Invoke the pre_randomize method before doing randomization.
34
35   The pre_randomize method, like the randomize method, is a method of all classes.
36   this->pre-randomize() is only called from the lowest-level randomize method,
37   meaning that the lowest-level pre-randomize method is called. "super" is used to
38   indicate a handle which points to the same instance as "this," but at one level
39   higher in the instance's class hierarchy.
40
41   pre_randomize is designed to automatically invoke super->pre_randomize(), thus
42   invoking pre_randomize on <instance> one hierarchy level up. The
43   pre_randomize invoked at one hierarchy level up will, in turn, recurse up the
```

Figure 17B

```
1   hierarchy chain to its super->pre_randomize(). This recursing up the instance's
2   hierarchy will continue until the pre_randomize at all levels of <instance> is
3   executed.
4
5   The default pre_randomize() method (which is a no-op at all hierarchy levels) can
6   be overridden by the user to do any form of initialization which should be
7   automatically done before random values are assigned. Similarly, the default
8   post_randomize() method (also a no-op at all hierarchy levels and also a method
9   of all classes), see infra, can be overridden by the user to do any post-processing
10  of the random values, and can even call randomize() again if desired. */
11  if (do_it == 1) this->pre_randomize();
12
13  /* All of the random variables, except those in nested sub-objects, in the entire
14  hierarchy of the instance, are randomized by the following calls to:
15          build_dag(highest_HLevel_record),
16          linearize_dag(highest_HLevel_record),
17          include_ON_rvars(highest_HLevel_record) and
18          randomize_simple_member_vars(highest_HLevel_record).
19
20  These functions are implemented in C and therefore the highest_HLevel_record
21  pointer is passed to each function. An alternative way to achieve this functionality
22  would have these functions as member functions (methods) of a base class
23  inherited by all classes. */
24  if (do_it == 1)
25  {
26          highest_HLevel_record = pointer to highest-level HLevel_record of current
27          instance, pointed to by the "this" handle;
28
29          build_dag(highest_HLevel_record);
30          linearize_dag(highest_HLevel_record);
31          include_ON_rvars(highest_HLevel_record);
32          success = randomize_simple_member_vars(highest_HLevel_record);
33  }
34
35  /* super->randomize(0) is used to randomize all random variables in all nested
36  sub-objects of the instance at levels of the hierarchy above the lowest level. As
37  with pre_randomize, each invokation of super->randomize(0) automatically
38  recurses up to the next level of the hierarchy chain. This recursing up the
39  instance's hierarchy will continue until randomize(0) is executed at all levels
40  (except for the lowest level). Since do_it is 0 for these randomize calls, randomize
41  will not do: pre_randomize, post_randomize, build_dag, linearize_dag,
42  include_ON_rvars and randomize_simple_member_vars. */
43  if (success == OK) success = super->randomize(0);
```

Figure 17C

```
1
2
3    /* Following loop finds all the sub-objects at the "this" level of the class hierarchy
4    and "tells" each such sub-object to randomize itself. These sub-objects are found
5    by looping over every random variable of the "this" hierarchy level in the instance.
6
7    It may be preferable, for purposes of improved performance, to "unroll" the
8    following loop at compile time (during the translation of Vera language constructs
9    to Vera assembly language) rather than at run time. */
10   for (ptr_to_rvar = each random variable pointer in the array of pointers located by
11   following this->ptr_to_all_rvar_ptrs)
12   {
13           if (ptr_to_rvar points to a nested random sub-object which is not an array)
14           {
15                   if (success == OK)
16                   {
17                           /* Interrogate sub-object to determine whether its randomness
18                           attribute is ON */
19                           if (this->rand_mode (REPORT, ptr_to_rvar) == ON)
20                           {
21                                   /* Test whether there is, in fact, a sub-object pointed to
22                                   by pointer of HLevel_vars which is pointed to by
23                                   ptr_to_rvar. "*" is a C programming language
24                                   dereferencing operation which returns the value of the
25                                   thing pointed to by "ptr_to_rvar." */
26                                   if (*ptr_to_rvar == null) print a warning;
27
28                                   /* There is, in fact, a sub-object, so "tell" sub-object to
29                                   randomize itself. */
30                                   else success = ptr_to_rvar->randomize ();
31                           }
32                   }
33           }
34
35           if (*ptr_to_rvar == a randomized array of sub-objects)
36           {
37                   /* do the same whether array is associative or not */
38                   for (idx = each index of array *ptr_to_rvar, from 0 through
39                   array_size - 1)
40                   {
41                           /* Interrogate the sub-object array member to determine
42                           whether its randomize attribute is currently ON */
43                           if (this->rand_mode (REPORT, *ptr_to_rvar, idx) == ON)
```

Figure 17D

```
1              {
2                      /* Test whether there is, in fact, a sub-object pointed to
3                      by pointer of HLevel_vars which is pointed to by this
4                      entry of the sub-object array. */
5                      if (*ptr_to_rvar[idx] == null) print a warning;
6
7                      /* There is, in fact, a sub-object assigned to this array
8                      index, so "tell" sub-object to randomize itself. */
9                      else success = ptr_to_rvar[idx]->randomize ();
10             }
11         }
12     }
13
14  } /* END loop over every random variable of this hierarchy level in instance */
15
16  /* post_randomize is designed to automatically invoke super->post_randomize(),
17  thus invoking post_randomize on <instance> one hierarchy level up. The
18  post_randomize invoked at one hierarchy level up will, in turn, recurse up the
19  hierarchy chain to its super->post_randomize(). This recursing up the instance's
20  hierarchy will continue until the post_randomize at all levels of <instance> is
21  executed. */
22  if (do_it == 1) this->post_randomize();
23
24  randomize = success;
25
26  } /* END randomize */
```

Figure 18A

```
1    build_dag(curr_instance)
2    {
3    /* Note: a pointer to the DAG data structure is stored in the first or highest
4    HLevel_record of the chain pointed to by the curr_instance handle. All access to
5    the DAG begins with this pointer. The notation "curr_instance->DAG" is used to
6    indicate this pointer. */
7
8        /* loop over each HLevel_record of instance */
9        for (HLevel_record_ptr = pointer to each HLevel_record in chain of curr_instance,
10       starting from first HLevel_record)
11       {
12           /* loop over each constraint_block of the HLevel_record currently referred to
13           by HLevel_record_ptr */
14           for (constraint_block_ptr = pointer to each constraint_block listed in current
15           HLevel_record under constraint_block_list)
16           {
17               /* Add to the DAG each constraint_block which represents either: i)
18               an associative array (which is always considered to be ON), or ii) a
19               constraint block which is ON and which is not overridden by a
20               constraint_block with the same name that belongs to an
21               HLevel_record at a lower level in the class hierarchy */
22               if
23               (
24                   (constraint_block_ptr->cons_block_name == "assoc_size")
25                   or
26                   (
27                       ( *(constraint_block_ptr->hidden_var_ptr) == ON)
28                       and
29                       (no lower level HLevel_record with a constraint_block
30                       of the same name)
31                   )
32               )
33
34               /* Adding the constraint block to the DAG. If the constraint block
35               would introduce a cycle into the DAG, then the constraint block is not
36               added and "cycle_found" is set to true */
37               {
38                   cycle_found = add_constraint_block_to_DAG(curr_instance,
39                   constraint_block_ptr);
40                   if (cycle_found) return NULL;
41               }
```

Figure 18B

```
1          } /* end constraint_block loop */
2      } /* end HLevel_record loop */
3   } /* end build_dag */
4
5
6   add_constraint_block_to_DAG (curr_instance, constraint_block_ptr)
7   {
8
9      /* begin with cycle_detected flag being unset */
10     cycle_detected = FALSE;
11
12     /* loop over each constraint, called "cons," in constraint blk */
13     for (cons = pointer to each one_constraint in the array pointed to by
14     constraint_block_ptr->cons_table_ptr)
15     {
16
17         /* Add the constraint to the DAG. For each constraint added, if it introduces
18            a cycle into the DAG, as constructed thus far, "cycle_detected" is set true */
19         cycle_detected = add_one_constraint_to_DAG (curr_instance, cons);
20
21         if (cycle_detected == TRUE) error(); /* Do appropriate error handling */
22     } /* end loop */
23
24     return cycle_detected;
25
26  } /* end add_constraint_block_to_DAG */
27
28
29  add_one_constraint_to_DAG (curr_instance, cons)
30  {
31
32     /* If lhs of constraint is already represented by a DAG node, then set "lhs_node" to
33        point to that DAG node */
34     if (cons->lhs already represented by a node in curr_instance->DAG)
35         lhs_node = pointer to DAG node representing cons->lhs;
36
37     /* Otherwise, create a new DAG node for the lhs and set lhs_node to point to it */
38     else
39     {
40         /* In the special case where the constraint is part of an "assoc_size"
41            constraint_block, the new DAG node created for the lhs will represent the
42            whole associative array as a symbolic unit, and the rhs will define the
```

Figure 18C

```
1           number of elements in the associative array that should be given random
2           values. */
3           create new DAG node representing cons->lhs;
4           lhs_node = pointer to the new DAG node representing cons->lhs;
5   }
6
7   /* Add to the DAG node representing the lhs of the one_constraint "cons" the
8   following data from cons: the relop and the start address of the Vera assembly
9   code for evaluating the rhs of cons. Each pair of relop/start_addr information is
10  added to the DAG node as a separate data object. The DAG node maintains a list
11  of its relop/start_addr objects since there will be multiple such objects when the
12  same random variable is the lhs variable of more than one constraint */
13  add_to_DAG_node(cons->relop, cons->start_addr, lhs_node);
14
15  /* Now make sure each random variable on rhs of cons is also represented by a
16  DAG node. Also need to create a "depends_on" relation from the lhs variable of
17  cons to each rhs random variable of cons -- unless this would introduce a cycle. */
18
19  /* loop over each random variable on rhs of cons */
20  for (rhs_rvar = pointer to each random variable from *(cons->rhs_vars) )
21  {
22          if (rhs_rvar already has a node in curr_instance->DAG pointed to by
23          rhs_node)
24          {
25                  if
26                  (
27                          /* Is there a direct cycle between lhs random variable and rhs
28                          random variable of a single constraint? If such a cycle is
29                          detected, the depends_on relation from lhs random variable to
30                          rhs random variable is not created in the DAG and
31                          cycle_detected is set. */
32                          (cons->lhs == rhs_rvar)
33
34                          or
35
36                          /* Is there some dependency, through any number of
37                          constraints, of rhs_rvar on the lhs random variable? If such a
38                          dependency is detected, the depends_on relation from lhs
39                          random variable to rhs random variable is not created in the
40                          DAG (since it would introduce a cycle) and cycle_detected is
41                          set. */
42                          (rhs_rvar depends on cons->lhs through some chain of
43                          constraints?)
```

Figure 18D

```
1              )
2              {
3                 cycle_detected = 1;
4                 return cycle_detected;
5              }
6
7           else
8           /* there is no cycle detected so add "depends on" edge */
9                 left_arg_depends_on_rt_arg (lhs_node, rhs_node);
10          }
11
12      else
13          {
14          /* Since rhs_rvar is not already in DAG the introduction of lhs
15          variable's dependence upon a rhs_var cannot create a cycle. */
16          create a new DAG node for rhs_rvar;
17          left_arg_depends_on_rt_arg (lhs_node, rhs_node);
18          }
19
20  } /* end loop over each rhs random variable */
21
22  cycle_detected = 0;
23  return cycle_detected;
24
25  }
26
27
28  left_arg_depends_on_rt_arg (dependent_node, independent_node)
29  {
30          unless such a pointer already exists, this procedure adds to the
31          depends_on_list of the dependent_node a depends_on_link pointing to the
32          independent_node;
33  }
```

Figure 19A

```
1    linearize_dag (curr_instance)
2    {
3
4    /* First give dag_nodes their ordering_numbers */
5    for (dnode = each dag_node of curr_instance->DAG)
6    {
7            if (dnode->ordering_number == NULL)
8            {
9                    dnode->ordering_number = 1;
10
11                   trace_and_number(dnode, 1);
12           }
13   } /* end for each dag_node of DAG */
14
15   sort dag_nodes of curr_instance->DAG in order of decreasing ordering_number;
16
17   } /* end linearize_dag */
18
```

Figure 19B

```
1    trace_and_number(dnode, curr_indep_level)
2    {
3
4    dnode_depends_on = list of pointers, where each pointer points to a dag_node
5    listed in dnode->depends_on_list;
6
7    for (traced_node = each dag_node on dnode_depends_on)
8    {
9            if
10           (
11                   (    (traced_node->ordering_number != NULL) &&
12                        (curr_indep_level + 1 > traced_node->ordering_number)
13                   )
14                   OR
15                   (traced_node->ordering_number == NULL)
16           )
17           {
18                   traced_node->ordering_number = curr_indep_level + 1;
19
20                   trace_and_number(traced_node, curr_indep_level + 1)
21           }
22   } /* end for each dag_node */
23
24   } /* end trace_and_number */
25
```

Figure 20A

```
1   include_ON_rvars(curr_instance)
2   {
3   /* This procedure ensures that exactly those random variables which are ON are
4   represented by a DAG node included in the ordered list with their do_randomize
5   field set to TRUE. Until this step, do_randomize is FALSE for all nodes. */
6
7   /* loop over each HLevel_record of instance */
8   for (HLevel_record_ptr = pointer to each HLevel_record in the chain pointed to by
9   curr_instance, starting from first HLevel_record)
10  {
11
12          /* loop over every random variable of this hierarchy level in instance */
13          for (ptr_to_rvar = pointer to each random variable as listed in array of
14          pointers that is pointed to by ptr_to_all_rvar_ptrs)
15          {
16                  if (ptr_to_rvar points to a non-array random variable)
17                          ensure_in_DAG (curr_instance, ptr_to_rvar);
18
19                  if (ptr_to_rvar points to a regular array)
20                          for (ptr_to_element = pointer to each element of array pointed
21                          to by ptr_to_rvar)
22                                  ensure_in_DAG (curr_instance, ptr_to_element);
23
24                  /* For associative arrays, do not actually create separate memory
25                  locations (DAG nodes) for each element now. The reason for this is
26                  not knowing yet how big the array will be, since its size may depend
27                  on other random variables. If ptr_to_rvar points to an associative
28                  array, then just one node is used now to represent the whole
29                  associative array as a symbolic unit. Later, in the step of assigning
30                  random values to each variable represented by a DAG node, when
31                  the node for this whole associative array is reached, the size of the
32                  array can be computed, and the DAG node for each individual array
33                  element will be created. */
34                  if (ptr_to_rvar points to an associative array)
35                          ensure_in_DAG (curr_instance, ptr_to_rvar);
36
37          } /* end loop over each random variable */
38  } /* end loop over each HLevel_record */
39  } /* end include_ON_rvars */
40
41
42  ensure_in_DAG (curr_instance, ptr_to_rvar)
43  {
```

```
1   /* ptr_to_rvar->rand_flag (as opposed to dnode->do_randomize) is the flag that is
2   stored as part of the information about the variable throughout a Vera run; it can
3   be changed by calling the rand_mode() function. */
4   if (ptr_to_rvar ->rand_flag is ON)
5       {
6               if (rvar pointed to by ptr_to_rvar is already represented by node in
7               curr_instance->DAG)
8                   {
9                           /* find the node in curr_instance->DAG representing
10                          the random variable pointed to */
11                          dnode = pointer to node in curr_instance->DAG, where
12                          the node represents the rvar pointed to by ptr_to_rvar;
13
14                          /* set the do_randomize flag to true in the DAG node */
15                          dnode->do_randomize = TRUE;
16                  }
17
18              else
19                  {
20                          /* If rvar is not already in curr_instance->DAG, its value
21                          must be unconstrained and therefore independent of all
22                          other random variables. While the DAG node for the
23                          rvar could be added anywhere in the ordered list, it is
24                          added at the beginning of the list since this permits the
25                          fastest processing */
26
27                          dnode = create a node to represent rvar and return a
28                          pointer to it, where the node created is of the same
29                          data type as those created for the DAG;
30
31                          add dnode to beginning of ordered list;
32
33                          dnode->do_randomize = TRUE;
34                  }
35          } /* end if rand_flag is ON */
36  } /* end ensure_in_DAG */
```

Figure 21A

```
1    randomize_simple_member_vars(curr_instance)
2    {
3
4        /* Due to list's ordering, all random variables which dnode depend on have already
5        been assigned values. */
6        for (dnode = pointer to each DAG node in the ordered list curr_instance->DAG,
7        from beginning to end, selecting only those nodes with do_randomize TRUE)
8        {
9            /* This is where the symbolic representation of an associative array gets
10           turned into actual nodes for each element based upon the value of its size-
11           determining expression. Since its size-determining expression may include
12           random variables, it must be evaluated at the right point in the ordered list.
13           The individual array elements of the associative array may or may not be
14           constrained. */
15           if (dnode points to a DAG node which represents an entire associative
16           array)
17           {
18               /* Due to the ordered list, all random variables, necessary for
19               evaluating the expression which determines the number of elements
20               to randomize, are available */
21               start_addr = get start_addr for Vera assembly code which evaluates
22               expression on rhs of assoc_size;
23
24               size = result of evaluating the Vera assembly code at start_addr;
25
26               /* Array element nodes created by this loop will be evaluated in
27               subsequent iterations of the enclosing "for" loop since these nodes
28               are inserted in the ordered list after the node indicated by dnode. In
29               this case, the node indicated by dnode represents the entire
30               associative array. */
31               for (i = 0 to (size - 1) )
32                   /* This check is necessary since specific elements of the
33                   associative array may have constraints and have therefore
34                   already been created. These specific elements are
35                   guaranteed to be located after the dnode, but whole portion of
36                   ordered array after dnode needs to be searched. */
37                   if (ordered list does not already contain a node representing
38                   the ith element of the associative array indicated by dnode)
39                       if (ith element of associative array indicated by dnode
40                       has not been turned OFF by rand_mode())
41                           /* It is preferable to add the nodes representing
42                           elements of the associative array, after the node
43                           symbolically representing the entire array, such
```

Figure 21B

```
1                           that they are in ascending order based upon
2                           their array index. */
3                           add a node representing the ith element to the
4                           ordered list after the node indicated by dnode;
5         }
6
7         else
8         {
9                   /* Whenever dnode appears on the lhs of a one_constraint, it had a
10                  relop/start_addr pair attached to it.  Each of these must now be
11                  evaluated to produce a set of valid ranges of values for the random
12                  variable represented by dnode.  This representation of the valid
13                  ranges is called a "set constraint" and evaluate_constraints
14                  concludes by setting the set_constraint_field of dnode to point to the
15                  set constraint data structure it creates. */
16                  evaluate_constraints (dnode);
17
18                  /* Now a value must be randomly selected from one of the valid
19                  ranges of dnode's set constraint. */
20                  set_random_value (dnode);
21        }
22
23  } /* end for loop */
24  }
25
26
27  evaluate_constraints (dnode)
28  {
29  /* Examples of type_min and type_max for several data types:
30          integer
31                  type_min = most negative signed integer representable in Vera (32
32                  bits)
33
34                  type_max = most positive signed integer representable in Vera (32
35                  bits)
36
37          bit[2:0]
38                  type_min = 0
39
40                  type_max = 7
41
42          (Notice the gaps in the range of values for this enum)
43          enum colors = none, red = 1, green = 2, blue = 4, yellow = 8;
```

Figure 21C

```
1              type_min = 0 -- this is the default value for the first enum, "none"
2
3              type_max = 8
4      */
5      type_min = min value of lhs rvar represented by dnode based on its data type;
6      type_max = max value of lhs rvar represented by dnode based on its data type;
7
8      eq_val_flag = 0;
9      user_min = UNDEFINED;
10     user_max = UNDEFINED;
11     set_constraint_flag = NULL;
12     eq_val = NULL;
13     ne_val = NULL;
14     aeq_val = NULL;
15     ane_val = NULL;
16
17     /* This loop steps through all the relop/start_addr pairs of dnode and takes
18     different actions depending upon the relop. One type of relop ("in," "!in" or "dist"), if
19     present as a constraint of dnode, will cause the creation of a set constraint. Only
20     one of these three relops can constrain a single random variable. Other
21     constraints may change the minimum or maximum value of dnode's random
22     variable. Yet other constraints will create lists of values which are not valid for the
23     random variable and therefore represent points at which the ranges of valid values
24     for the random variable must be "split." */
25     for (relop_start_addr_pair = each relop/start_addr pair of
26     dnode->relop_start_addr_list)
27     {
28
29             relop_current = relop of relop_start_addr_pair;
30
31             start_addr_current = start_addr of relop_start_addr_pair;
32
33             rhs_constraint_current = run Vera assembly code at start_addr_current
34             through Vera assembly code interpreter and return pointer to result;
35
36             /* Used for a one_constraint which is a conditional that has returned "void"
37             as its value. In this case, the one_constraint will have no effect on its lhs
38             random variable, so just skip to the next relop/start_addr pair. See Section
39             9.3.3.4 "Void Constraints" of Microfiche Appendix. */
40             if (rhs_constraint_current == VOID_DATA) continue;
41
42             /*
```

Figure 21D

```
1   if (relop_current == "in") then result returned by Vera assembly code
2   interpreter is already a set of ranges of the necessary form. The result is a
3   pointer to a set_constraint data structure, which is an array of tuples, where
4   each tuple specifies: low end of range, high end of range, weight for the
5   range, apportionment of weight over range (:= or :/).
6
7   To make later processing easier (i.e., avoid need to special case for "in" or
8   "!in" versus "dist") the "weight" is set to 1 for each value of the ranges.
9
10  if (relop_current == "dist") then result returned by Vera assembly code
11  interpreter is already a set of weighted ranges of the necessary form. The
12  result in a pointer to a set_constraint data structure, which is an array of
13  tuples, where each tuple specifies: low end of range, high end of range,
14  weight for the range, apportionment of weight over range (:= or :/).
15  */
16
17  if (relop_current == "!in")
18  {
19          /* Invert the ranges of the set_constraint as returned by Vera
20          assembly code interpreter. As with "in," the "weight" is set to 1 for
21          each value of the ranges. */
22          invert_ranges(rhs_constraint_current);
23  }
24
25  /* create another pointer to set_constraint data structure returned by Vera
26  assembly code interpreter */
27  if (relop_current == "in" "!in" or "dist") set_constraint_current =
28  rhs_constraint_current;
29
30  if (relop_current is "<" "<=" ">" or ">=")
31  {
32          /* The value of rhs_constraint_current returned by Vera assembly
33          interpreter will be number */
34
35          has_inconsistency = update, if appropriate, user_min or user_max
36          based upon whether rhs_constraint_current and relop_current further
37          constrain the already existing value for user_min or user_max;
38
39          /* update also checks for logical inconsistency between these
40          constraint values and returns true if one found */
41          if (has_inconsistency)
```

Figure 21E

```
                print an error message to user that constraints are logically
                inconsistent and stop any further processing of randomize
                method;

/* Example update: Suppose rhs_constraint_current = 5;
                relop_current = "<" (which means lhs rvar must be <
                rhs_constraint_current); and current value of user_max = 10.  Since
                the maximum value of lhs rvar represented by dnode must be less
                than 5, user_max is updated to be = 4.

Example logical inconsistency: lhs rvar must both be less than 5 and
                greater than 7 */
        } if (relop_current is "==")
        {
                /* The value of rhs_constraint_current returned by Vera assembly
                interpreter will be number */ if (
                        (eq_val_flag != NULL)
                        &&
                        (eq_val != rhs_constraint_current)
                )
                        print error message to user that constraints are logically
                        inconsistent and stop all further processing of randomize
                        method;

eq_val == rhs_constraint_current;

eq_val_flag = 1;
        } if (relop_current is "!=")
        {
                /* The value of rhs_constraint_current returned by Vera assembly
                interpreter will be number */ add value pointed to by rhs_constraint_current to list ne_val;
        } if (relop_current is "=?=")
        {
```

Figure 21F

```
1       /* The value of rhs_constraint_current returned by Vera assembly
2          interpreter will be a bit pattern (which is later converted into a list of
3          numbers). lhs rvar must be equal to one of the numbers represented
4          by this bit pattern. A bit pattern is a specification of the form:
5          <number of bits>'<base><number specification>, as specified in
6          Microfiche Appendix at Sections 3.1.6 and 3.6.1. The <base> can
7          be "b" for binary, "o" for octal or "h" for hexadecimal. This
8          specification represents a bit pattern, as opposed to a literal binary
9          number, because the <number specification> can contain "x" or "z"
10         for various digit positions to represent "don't care" bits. The "=?="
11         operator which operates upon bit patterns of aeq_val is discussed
12         specifically in Section 3.6.1, Microfiche Appendix. */
13
14         add bit pattern pointed to by rhs_constraint_current to list of bit
15         patterns pointed to by "aeq_val";
16    }
17
18    if (relop_current is "!?=")
19    {
20         /* The value of rhs_constraint_current returned by Vera assembly
21         interpreter will be a bit pattern. lhs rvar must not be equal to any one
22         of the numbers represented by this bit pattern. The "!?=" operator
23         which operates upon the bit patterns of ane_val is discussed
24         specifically in Section 3.6.1, Microfiche Appendix. */
25
26         add bit pattern pointed to by rhs_constraint_current to list of bit
27         patterns pointed to by "ane_val";
28
29    }
30
31 } /* end loop over each relop/start_addr pair attached to dnode */
32
33 /* Now all the relop/start_addr pairs of dnode have been evaluated. The results of
34 these evaluation must now be combined to produce a single set constraint data
35 structure which represents all the valid ranges of values for the random variable.
36 This is what is accomplished by the remainder of evaluate_constraints. */
37
38 /* A set constraint data structure may already exist, depending upon what types of
39 operators were specified by the Vera language programmer as constraining this
40 random variable. Even if a set constraint does not already exist, it will be created
41 now. This provides a set constraint "foundation" with which the remainder of
42 evaluate_constraints can work with. */
43 if (set_constraint_current == NULL)
```

Figure 21G

```
1   {
2         /* No operators of type "in" "!in" or "dist" constrain the lhs rvar of dnode.
3         Create a set_constraint from type_min, type_max, user_min and user_max.
4         The apportionment operator in the set_constraint created will be ":=" with
5         each value in the range given a weight of "1." */
6         set_constraint_current = create a set_constraint from type_min, type_max,
7         user_min and user_max;
8   }
9   else
10        adjust existing set_constraint, assigned to set_constraint_current, to be
11        consistent with type_min, type_max, user_min and user_max;
12
13
14  /* Initialize each range of set_constraint_current to have its num_values field set to
15  the number of valid values as indicated by its high_end and low_end. */
16  for (curr_range = each range of set_constraint_current)
17        curr_range->num_values = (curr_range->high_end - curr_range->low_end)
18        + 1;
19
20
21  /* First possible adjustment to set constraint if random variable is constrained by a
22  value it must be equal to. */
23  if (eq_val != NULL)
24  {
25        if (eq_val not within one of the ranges of set_constraint_current)
26              print error and halt all processing of randomize method;
27
28        /* No further processing necessary since set_random_value will just return
29        the eq_val for this dnode. */
30        return;
31  }
32
33
34  /* Second possible adjustment to set constraint if random variable is of the
35  enumerated type. This adjustment is based upon the information stored with the
36  basic variable type, rather than being based upon constraints. */
37  if (lhs rvar of dnode is of type "enum" && the enum values are not all consecutive
38  integers)
39  {
40        enumerated_values = obtain list of permissible values for lhs rvar of dnode;
41
42        for (curr_range = pointer to each range in set_constraint_current)
43        {
```

Figure 21H

```
1    curr_range_intersection = number of enumerated_values that fall
2    within curr_range as specified by curr_range->low_end and
3    curr_range->high_end;
4
5    if (curr_range_intersection == 0)
6            /* curr_range has zero intersection with permissible values of
7            this enumerated type so eliminate curr_range */
8            remove the range from set_constraint_current;
9
10   else
11           /* if intersection between curr_range and enumerated_values
12           is less than the total number of values currently part of
13           curr_range, then curr_range must be split. */
14           if (curr_range_intersection < curr_range->num_values)
15           {
16                   curr_range->num_values = curr_range_intersection;
17
18                   /* The following loop splits the curr_range into
19                   sub_ranges, that is, creates a linked list of the
20                   sub_ranges that the curr_range is split into. The
21                   pointer sub_ranges of curr_range points to the head of
22                   this linked list. A "group" of enumerated_values is
23                   defined to be a largest unit of sequential values within
24                   enumerated_values. For example, if the
25                   enumerated_values are 0, 1, 2, 4, 5, 9 and 10, then
26                   there would be the following three groups: (0, 1, 2), (4,
27                   5), and (9, 10). */
28                   for (curr_group = each group of enumerated_values
29                   within curr_range)
30                   {
31                           sub_range_curr = create a new sub_range;
32
33                           sub_range_curr->low_end = lowest value of
34                           curr_group;
35
36                           sub_range_curr->high_end = highest value of
37                           curr_group;
38
39                           sub_range_curr->num_values = number of
40                           values in curr_group; /* which is the same as
41                           (sub_range_curr->high_end -
42                           sub_range_curr->low_end) + 1 */
```

Figure 21I

```
1                       add sub_range_curr to the linked list
2                       curr_range->sub_ranges;
3               }
4
5           } /* end if (curr_range_intersection <
6           curr_range->num_values) */
7
8       } /* end loop for each range in set_constraint_current */
9
10  } /* end if (lhs rvar of dnode is of type "enum") */
11
12
13  /* Third possible adjustment to set constraint if random variable is constrained by
14  values which it cannot be. */
15  if (ne_val != NULL)
16          split ranges of set_constraint_current for each value on ne_val list, with
17          each range having a pointer to its own linked list of sub_ranges it has been
18          split into;
19
20          /* Example of range splitting: Suppose set_constraint_current has a single
21          range of {1; 10; ":="; 1} and ne_val = 5. Then set_constraint_current is
22          altered to point to the following linked list of sub_ranges: {1; 4; ":="; 1} and
23          {6; 10; ":="; 1}. */
24
25
26  /* Fourth possible adjustment to set constraint if random variable is constrained by
27  values which it cannot be. */
28  if (ane_val != NULL)
29  {
30          for (bit_pattern_curr = each bit pattern on ane_val list)
31          {
32                  disallowed_values = list of disallowed numbers which
33                  bit_pattern_curr has been converted into;
34
35                  for (range_curr = each range of set_constraint_current)
36                          split range_curr such that it points to a linked list of
37                          sub_ranges that only contain non-disallowed values, where
38                          the num_values field of each sub_range is set to the number
39                          of values in that sub_range;
40          }
41  }
```

Figure 21J

```
1   /* Fifth possible adjustment to set constraint if random variable is constrained by
2   values which it must be equal to. */
3   if (aeq_val != NULL)
4   {
5           for (bit_pattern_curr = each bit pattern on aeq_val list)
6           {
7                   allowed_values = list of allowed numbers which bit_pattern_curr has
8                   been converted into;
9
10                  /* Invert list because it is a simpler algorithm to remove illegal values
11                  than to generate the intersection of two sets of legal values when
12                  one set of values is specified by a bit pattern. */
13                  disallowed_values = invert list of allowed_values;
14
15                  for (range_curr = each range of set_constraint_current)
16                          split range_curr such that it points to a linked list of
17                          sub_ranges that only contain non-disallowed values, where
18                          the num_values field of each sub_range is set to the number
19                          of values in that sub_range;
20          }
21  }
22
23
24  /* Following loop computes a total (called new_range_count), for
25  set_constraint_current, of the total number of sub_ranges in every range which
26  has sub_ranges, plus the total number of ranges without sub_ranges.
27
28  Following section also computes an adjustment_factor by which weights
29  associated with an apportion_op of type ":/" may need to be multiplied. The
30  adjustment_factor allows the weight to be apportioned as an integer amount to any
31  sub_ranges. This permits faster integer arithmetic to be utilized.
32
33  If one range is multiplied by an adjustment_factor, all ranges must be multiplied by
34  the same factor, to maintain the relative weightings of the different ranges.
35  Therefore this loop computes an adjustment_factor that will later be applied to all
36  ranges.
37
38  Some additional optimizations, not shown in the pseudo-code below, are used to
39  keep the adjustment_factor small. This is desirable to keep the weight fitting in an
40  integer size directly supported by the computer's hardware so that the
41  computations are fast, as opposed to representing very large integers with the
42  Vera language bit type (see Microfiche Appendix, 3.2.2) in conjunction with
43  software.
```

Figure 21K

```
1
2    These additional optimizations:
3    i) check if the weight assigned to the range already evenly divides by the number
4    of values in the range (in which case an adjustment_factor is not needed);
5
6    ii) check if the number of values in the range already evenly divide the
7    adjustment_factor; and
8
9    iii) if the adjustment_factor times the number of values in a range would be too
10   large to represent in a hardware-supported integer, then an approximation is
11   achieved by producing the largest adjustment_factor which, when multiplied by the
12   largest weight of any range, still fits within a hardware-supported integer. */
13   new_range_count = 0; /* initialize */
14
15   adjustment_factor = 1; /* initialize */
16
17   for (curr_range = each range in set_constraint_current)
18   {
19           if (curr_range has no list of sub_ranges)
20                   /* curr_range will correspond to only one range in
21                   new_set_constraint */
22                   new_range_count = new_range_count + 1;
23           else
24           {
25                   /* each sub_range of curr_range will be an entire range in
26                   new_set_constraint */
27                   new_range_count = new_range_count + number of sub_ranges of
28                   curr_range;
29
30                   if (curr_range's weight apportionment is ":/")
31                           /* In order to ensure that weight per valid value of curr_range
32                           is an integer, while ensuring that relative weights among
33                           ranges stay the same, need to compute an adjustment factor
34                           which is a product of the number of valid values in each
35                           curr_range which is apportioned by ":/" */
36                           adjustment_factor = adjustment_factor *
37                           curr_range->num_values;
38           }
39   }
40
41   /* Now multiply all the range weights by the adjustment factor */
42   for (curr_range = each range in set_constraint_current)
43           curr_range->weight = adjustment_factor * curr_range->weight;
```

Figure 21L

```
1
2    create new_set_constraint structure, containing new_range_count empty ranges;
3
4    /* Copy ranges and sub_ranges of set_constraint_current to ranges of
5    new_set_constraint. If a range to be copied has sub_ranges, in addition to
6    copying the sub_range information of set_constraint_current to new ranges, the
7    range's weight is distributed appropriately to the new ranges representing its
8    sub_ranges. */
9    for (curr_range = each range in set_constraint_current)
10   {
11           if (curr_range has no linked list of sub_ranges)
12                   copy curr_range to the next empty range element in the
13                   new_set_constraint;
14           else
15                   for (curr_sub_range = each sub_range in the linked list of
16                   curr_range)
17                   {
18                           if (weight apportionment of curr_range is ":=")
19                                   /* Use curr_sub_range as temporary storage */
20                                   copy the weight and the weight apportionment of
21                                   curr_range to curr_sub_range;
22                           else
23                           {
24                                   /* Weight per valid value of curr_range is guaranteed to
25                                   be an integer because curr_range->weight has been
26                                   multiplied by adjustment_factor */
27                                   weight_per_range_value = (curr_range->weight /
28                                   curr_range->num_values);
29
30                                   curr_sub_range_proportional_share =
31                                   weight_per_range_value *
32                                   curr_sub_range->num_values;
33
34                                   /* Copy to weight field of curr_sub_range the
35                                   proportional share for curr_sub_range of the weight of
36                                   curr_range. */
37                                   curr_sub_range->weight =
38                                   curr_sub_range_proportional_share;
39
40                                   /* set apportion_op field of curr_sub_range to the
41                                   weight apportionment operator ":/" */
42                                   curr_sub_range->apportion_op = ":/"
43                           }
```

Figure 21M

```
                    copy the curr_sub_range to the next empty range element in
                    the new_set_constraint;
            }
} /* end for each range in set_constraint_current */ set dnode to have its set_constraint_field point to new_set_constraint;

} /* end evaluate_constraints */

/* Select, randomly, a value for the random variable from the ranges of valid
values determined by evaluate_constraints. */
set_random_value(dnode)
{

/* If random variable has been constrained to a single valid value, then it's easy
just to pick that single value! */
if (eq_val for this dnode)
{
        use that eq_val to set value of *(dnode->rvar_pointer);
        return;
}

/* "select_range" randomly selects one of the ranges in the set constraint for the
random variable of dnode. */
range_selected = select_range(dnode);

/* The rest of set_random_value randomly picks a value from within the selected
range. */ range_high_value = high value of range_selected within
dnode->set_constraint_field;

range_low_value = low value of range_selected within
dnode->set_constraint_field;

range_magnitude = (range_high_value – range_low_value) + 1;

ok = FALSE while (ok == FALSE)
{
```

Figure 21N

```
1   /* The Unix random function, used by
2   generate_random_value_using_Unix_random_function, returns a 32-bit
3   value. If range_magnitude is larger than 32 bits, the Unix random function
4   will be called as many times as necessary to produce at least as many
5   random bits as there are in the binary representation of range_magnitude.
6   */
7   starter_rand_val =
8   generate_random_value_using_Unix_random_function();
9
10  /* Add to range_low_value the result of modulo dividing the
11  starter_rand_value by the range_magnitude. This gives an actual_rand_val
12  that is within the range. */
13  actual_rand_val = range_low_value + (starter_rand_val modulo
14  range_magnitude);
15
16  /* Whatever value of actual_rand_val is, it's OK to use for a regular random
17  variable of type "rand," so end while loop. */
18  if ( *(dnode->rvar_pointer) is a "rand" variable)
19          ok = TRUE;
20
21  /* For a randc variable, we must check whether actual_rand_val has
22  already been generated. */
23  else /* *(dnode->rvar_pointer) is a "randc" variable */
24  {
25          if (actual_rand_val has not been used yet in this cycle, as indicated
26          by the rtable of *(dnode->rvar_pointer) )
27                  ok = TRUE;
28          else
29                  if (there are no values that have not been used yet in this
30                  cycle of the randc variable as indicated by the rtable of
31                  *(dnode->rvar_pointer) )
32                  {
33                          reset the rtable to indicate all values as unused, except
34                          for the current value of actual_rand_val which is
35                          checked off as the first value generated in the new
36                          cycle;
37                          ok = TRUE;
38                  }
39
40          /* Keep generating values for actual_rand_val until one is
41          found which is not already checked off in rtable of
42          *(dnode->rvar_pointer). If several attempts within the selected
```

Figure 21O

```
1              range do not produce such a value, the code will look through
2              all the ranges for a value which is not already checked off. */
3          else
4                  ok = FALSE;
5
6      } /* end else randc variable */
7
8  } /* end while */
9
10 /* Set random variable to have the random value generated. */
11 *(dnode->rvar_pointer) = actual_rand_val;
12
13 if ( *(dnode->rvar_pointer) is a randc variable)
14         mark the bit in rtable, corresponding to actual_rand_val, to indicate that
15         actual_rand_val has been generated in this cycle;
16
17 } /* end set_random_value */
18
19
20
21 select_range(dnode)
22 {
23
24 /* if lhs rvar has only one range of legal values, this range is always at the first
25 index of zero in the set_constraint tuple array pointed to by set_constraint_field */
26 if (dnode->set_constraint_field has only one range)
27         return 0;
28
29 for (curr_range = each range of dnode->set_constraint_field addressed by a
30 range_index)
31 {
32         if (curr_range distribution is ":/")
33                 target_size = weight listed in range;
34         else
35                 target_size = (number of values in curr_range) X (weight per item in
36                 curr_range);
37
38         if (range_index == 0)
39         {
40                 subtotal[0] = target_size;
41         }
42
43         else
```

Figure 21P

```
1      {
2              subtotal[range_index] = target_size + subtotal[range_index - 1];
3      }
4  }
5
6  largest_subtotal = subtotal[largest_range_index];
7
8  /* Generate, by the following two steps, a random number >= 1 and <=
9  largest_subtotal */
10 any_random = any random number;
11 limited_random = (any_random divided divided modulo largest_subtotal) + 1;
12
13 selected_range = the index of the range of dnode->set_constraint_field whose
14 corresponding subtotal[selected_range] is the largest subtotal that is still less than
15 or equal to the limited_random;
16
17 return selected_range;
18
19 }
```

Figure 22A

```
1   constraint_mode (flag, constraint_block_name)
2   {
3
4   if (flag == REPORT)
5   {
6           if (constraint_block_name == NULL)
7                   error();
8
9           /* loop over each HLevel_record of instance */
10          for (HLevel_record_ptr = pointer to each HLevel_record in chain of current
11          instance, pointed to by "this" handle, starting from lowest level
12          HLevel_record)
13          {
14                  /* loop over each constraint_block of the HLevel_record currently
15                  referred to by HLevel_record_ptr */
16                  for (constraint_block_ptr = pointer to each constraint_block listed in
17                  current HLevel_record under constraint_block_list)
18                  {
19                          if (constraint_block_ptr ->cons_block_name ==
20                          constraint_block_name)
21                                  return constraint_block_ptr ->hidden_var;
22                  }
23          }
24  }
25
26  else if (flag == OFF or flag == ON)
27  {
28
29          /* loop over each HLevel_record of instance */
30          for (HLevel_record_ptr = pointer to each HLevel_record in chain of current
31          instance, pointed to by "this" handle, starting from the lowest level
32          HLevel_record)
33          {
34                  /* loop over each constraint_block of the HLevel_record currently
35                  referred to by HLevel_record_ptr */
36                  for (constraint_block_ptr = pointer to each constraint_block listed in
37                  current HLevel_record under constraint_block_list)
38                  {
39                          if
40                          (
41                                  (constraint_block_ptr->cons_block_name ==
42                                  constraint_block_name)
43                                          or
```

```
1                          (
2                                  (constraint_block_name == NULL)
3                                         and
4                                  (constraint_block_ptr->cons_block_name !=
5                                  "assoc_size")
6                          )
7                  )
8                          constraint_block_ptr->hidden_var = flag;
9           } /* end loop */
10      } /* end loop */
11   } /* end else if */
12
13   } /* end constraint_mode */
```

Figure 23A

```
1    /* "boundary" sets the random variables, represented by the instance it is applied
2    to, to a combination of boundary values according to the "sequence" parameter
3    and according to instance's current state. The current state of the instance is
4    determined by the sequence of previous calls to "boundary." "sequence" is
5    passed the value FIRST or NEXT. The value FIRST is passed in order to reset the
6    instance to begin a new sequence.
7
8    The method call will return the value OK for each successive call until the last
9    selection of boundary values, when it will return OK_LAST. If the user calls the
10   method with the NEXT parameter after the last selection of boundary values has
11   already been given (that is, after the method has returned OK_LAST), the method
12   will return PAST_IT. If the constraints are such that some variable cannot be
13   assigned any boundary value, for some selection of boundary values for the other
14   random variables, the method will return FAIL. If the instance has no random
15   variables anywhere in its inheritance hierarchy (no random variables and random
16   sub-objects), or if all its random variables are inactive due to use of rand_mode(),
17   the method will return NO_VARS. The algorithm uses the value INITIAL internally,
18   but never returns that value to the user.
19   */
20   boundary (sequence, do_it = 1)
21   /* SUMMARY: Let <instance> represent the handle of an instance and let the
22   method call to "boundary" for <instance> be of the form "<instance>.boundary (
23   <FIRST/NEXT> )." The result of such a method call is to assign appropriate first
24   boundary values to all the ON random variables (whether a built-in data type of
25   Vera or a sub-object) at each level of <instance>'s hierarchy. The boundary value
26   given to each variable that is a built-in data type must satisfy all ON constraints,
27   where the constraint's level in the class hierarchy of <instance> is equal to or
28   lower than the constrained variable's level. Similarly, the boundary values are
29   given within the sub-objects to its built-in data types: values are assigned to ON
30   random variables and the values must satisfy all ON constraints, where the
31   constraint's level in the class hierarchy, from which the sub-object is composed, is
32   lower than or equal to the constrained variable's level. Essentially, sub-objects
33   "take care of themselves" by being given their own "boundary" method call which
34   does a boundary value assignment process independent of <instance>'s. This
35   permits boundary to operate recursively, in the cases where the sub-objects
36   themselves have sub-objects.
37
38   The result of a method call with the NEXT parameter is similar to a call with the
39   FIRST parameter, except that a succeeding selection of boundary values is
40   assigned.
41
42   The user's call to <instance>'s boundary method, of the form
43   "<instance>.boundary ( <FIRST/NEXT> )," has the "do_it" parameter set to the
```

Figure 23B

```
1    default value of 1 and begins with the semantics as viewed from the lowest level of
2    the class hierarchy. This semantic level means that if any constraint blocks at a
3    lower level of the hierarchy use the same name as a constraint block at a higher
4    level of the hierarchy, the lowest level definition under that name completely
5    determines the meaning of that name.
6
7    "rvar" in the pseudo-code of all the Appendices is an abbreviation for "random
8    variable." */
9    {
10   /* set default value to be returned by boundary() as OK */
11   success = INITIAL;
12   remembered_success = INITIAL;
13
14   group_sequence = sequence;
15
16   direction = FORWARD;
17   last_turn = -1;        // last actual (non-null) turn -- not yet known
18
19   /* Invoke the pre_boundary method before doing boundary value assignment.
20
21   The pre_boundary method, like the boundary method, is a method of all classes.
22   this->pre_boundary() is only called from the lowest-level randomize method,
23   meaning that the lowest-level pre_boundary method is called. "super" is used to
24   indicate a handle which points to the same instance as "this," but at one level
25   higher in the instance's class hierarchy.
26
27   pre_boundary is designed to automatically invoke super->pre_boundary(), thus
28   invoking pre_boundary on <instance> one hierarchy level up. The pre_boundary
29   invoked at one hierarchy level up will, in turn, recurse up the hierarchy chain to its
30   super->pre_boundary(). This recursing up the instance's hierarchy will continue
31   until the pre_boundary at all levels of <instance> is executed.
32
33   The default pre_boundary() method (which is a no-op at all hierarchy levels) can
34   be overridden by the user to do any form of initialization which should be
35   automatically done before random values are assigned. Similarly, the default
36   post_boundary() method (also a no-op at all hierarchy levels and also a method of
37   all classes), see infra, can be overridden by the user to do any post-processing of
38   the random values, and can even call boundary() again if desired. */
39   if (do_it == 1) this->pre_boundary(sequence);
40
41
42   /* The following description assumes a Vera programmer's call where execution of
43   boundary begins at the lowest level HLevel_record. The boundary method
```

Figure 23C

```
1   operates upon three kinds of groups of random variables: (i) those which are built-
2   in Vera data types, in this HLevel_record and in HLevel_records above this
3   HLevel_record in the hierarchy, but not in sub-objects; (ii) those which are sub-
4   objects of the HLevel_records above this HLevel_record in the hierarchy; and (iii)
5   those which are sub-objects of this HLevel_record. The sub-objects are assigned
6   boundary values after the built-in data types, since there may be an associative
7   array of sub-objects, where the array's assoc_size (the number of array elements
8   operated upon) depends on the boundary values assigned to the built-in data
9   types.
10
11  These groups of variables are operated on in turn, and the method keeps track of
12  which group of random variables to vary on this call to the method, by using the
13  variable called curr_turn. This is conceptually similar to the list of DAG nodes
14  operated on by boundary_simple_member_vars, but the group members are not in
15  fact stored in a list. */
16
17  if (sequence == FIRST) {
18          if (do_it == 1)
19                  first_turn = 0; // begin with the turn item for built-in Vera data types
20          else
21                  first_turn = 1; // skip the built-in Vera data types turn item
22
23          completed_turn = first_turn - 1;   /* keep track of the last turn item that has
24          been completely processed or needs no processing -- analogous to
25          completed_dnode in Appendix 8 */
26
27          past_the_last_turn = first_turn + 1;  /* analogous to last_dnode in Appendix
28          8, but not quite -- this variable is one step PAST the last turn. True value
29          unknown at this time; for now, just make it big enough to let the while loop
30          execute. */
31
32          curr_turn = first_turn;        // analogous to curr_dnode in Appendix 8
33  }
34
35  else { // sequence == NEXT
36          /* If all turn items have already been assigned all boundary values, return
37          PAST_IT. */
38          if (completed_turn == past_the_last_turn - 1) {
39                  if (do_it == 1) this->post_boundary(sequence);
40                  return PAST_IT;
41          }
```

Figure 23D

```
1    /* If the last call to boundary terminated normally, then curr_turn is initialized
2    to "point to" the last turn item. */
3    if (curr_turn >= past_the_last_turn) {
4            curr_turn = past_the_last_turn - 1;
5            direction = REVERSE;
6    }
7  }
8
9
10  while (success != FAIL && curr_turn < past_the_last_turn) {
11          /* It is necessary to keep track dynamically of what number turn
12          corresponds to which turn item, since an associative array of sub-objects
13          may vary in size.  dynamic_turn_count will be updated for each turn item. */
14
15          dynamic_turn_count = 0;   // Initialize it.
16
17          /* First boundarize section for Vera built-in data types for all HLevel_records
18          */
19          if (curr_turn == dynamic_turn_count)
20                  if (do_it == 1) {
21                          /* Randomize the first turn item of variables.  All of the random
22                          variables, except those in nested sub-objects, in the entire
23                          hierarchy of the instance, are assigned boundary values by
24                          the following calls to:
25                                  build_dag(highest_HLevel_record),
26                                  linearize_dag(highest_HLevel_record),
27                                  include_ON_rvars(highest_HLevel_record) and
28                                  boundary_simple_member_vars(sequence,
29                                  highest_HLevel_record).
30
31                          These functions are implemented in C and therefore the
32                          highest_HLevel_record pointer is passed to each function.  An
33                          alternative way to achieve this functionality would have these
34                          functions as member functions (methods) of a base class
35                          inherited by all classes. */
36                          highest_HLevel_record = pointer to highest-level
37                          HLevel_record of current instance, pointed to by the "this"
38                          handle;
39
40                          if (sequence== FIRST)
41                          {
42                                  build_dag(highest_HLevel_record);
43                                  linearize_dag(highest_HLevel_record);
```

Figure 23E

```
1                    include_ON_rvars(highest_HLevel_record);
2                }
3
4                /* do following, regardless of whether its sequence is FIRST
5                or NEXT */
6                success = boundary_simple_member_vars(group_sequence,
7                highest_HLevel_record);
8
9                /* Update the variable keeping track of the last turn item that
10               must be processed. */
11               last_turn = curr_turn;
12           } // end of "if (do_it == 1)
13       } // end of "if (curr_turn == dynamic_turn_count)"
14
15       dynamic_turn_count += 1;        // Update it.
16
17
18       /* Second boundarize section for sub-objects of HLevel_records above the
19       current HLevel_record */
20       if (curr_turn == dynamic_turn_count)
21       {
22               /* If it is being executed as part of a call to the lowest-level boundary
23               method, super->boundary(group_sequence, 0) is used to assign
24               boundary values to all random variables in all nested sub-objects of
25               the instance at levels of the hierarchy above the lowest-level
26               HLevel_record. As with pre_boundary, each invocation of
27               super->boundary(group_sequence, 0) automatically recurses up to
28               the next level of the hierarchy chain. This recursing up the
29               instance's hierarchy will continue until boundary(group_sequence, 0)
30               is executed at all levels (except for the lowest level). Since do_it is 0
31               for these boundary calls, boundary will not do: pre_boundary,
32               post_boundary, build_dag, linearize_dag, include_ON_rvars and
33               boundary_simple_member_vars. */
34               success = super.boundary(group_sequence, 0);
35               last_turn = curr_turn;
36       }
37
38       dynamic_turn_count += 1;
39
40
41       /* Below is an example of a third boundarize section code block that is
42       repeated as applying to each individual sub-object of the current level
43       HLevel_record of this instance.
```

Figure 23F

```
1
2    It is preferrable for there to be a separate code block for each individual
3    sub-object or array of sub-objects, because each sub-object might be an
4    instance of a different class, and the boundary() method appropriate to that
5    particular class must be called. The code blocks are actually in the order
6    that the sub-objects are declared within this object, so individual sub-object
7    code blocks of this third boundarize section could be interspersed with code
8    blocks for arrays of sub-objects of the fourth boundarize section below.
9    */
10   if (curr_turn == dynamic_turn_count)
11   {
12           /* Interrogate sub-object to determine whether its randomness
13           attribute is ON */
14           if (this->rand_mode (REPORT, indiv_sub_obj) == ON)
15           {
16                   /* Randomize this turn item: those in the sub-object -- unless
17                   the Vera programmer has not instantiated the sub-object with
18                   new (or has deleted it after instantiating it). */
19                   if (indiv-sub-object == null) {
20                           /* Print a warning message, but only the first time
21                           boundary() is called -- no need to inundate them with
22                           warnings :-) . */
23                           if (sequence == FIRST) print a warning message;
24                   }
25                   else {
26                           success = indiv-sub-obj.boundary(group_sequence, 1);
27                           last_turn = curr_turn;
28                   }
29           } // if rand_mode(...) == ON
30   }
31   dynamic_turn_count += 1;
32
33
34
35   /* Fourth boundarize section for each array of random sub-objects in this
36   instance. For each such random array, there will be a code block with the
37   following form. */
38
39   /* Calculate the array index that would correspond to curr_turn. */
40   curr_index = curr_turn - dynamic_turn_count;
41
```

Figure 23G

```
1    /* If the array is an associative array, calculate its current "assoc_size" and
2    assign it to "array_size". If the array is a non-associative array, its size is
3    known; use that for "array_size". */
4    if (sub-object-array is an associative array)
5            array_size = current value of assoc_size of sub-object-array;
6    else
7            array_size = fixed size of this non-associative array sub-object-array;
8
9    /* If curr_turn actually corresponds to a legal array index for this array */
10   if (curr_index >= 0 && curr_index < array_size)
11   {
12           /* Interrogate sub-object to determine whether its randomness
13           attribute is ON */
14           if (this->rand_mode (REPORT, sub-object-array, curr_index) == ON)
15           {
16                   /* Randomize this turn item: those in the element of the sub-
17                   object array -- unless the Vera programmer has not
18                   instantiated the element with new (or has deleted it after
19                   instantiating it). */
20                   if (sub-object-array[curr_index] == null) {
21                           /* Print a warning message, but only the first time
22                           boundary() is called -- no need to inundate them with
23                           warnings :-) . */
24                           if (sequence == FIRST) print a warning message;
25                   }
26                   else {
27                           success = sub-object-array[curr_index].boundary
28                           (group_sequence, 1);
29                           last_turn = curr_turn;
30                   }
31           } // if rand_mode(...) == ON
32   }
33   dynamic_turn_count += array_size;
34
35
36   /* Set past_the_last_turn, now that we know how many turn items there are
37   -- note that variable-size assoc. arrays make this something that can't be
38   calculated earlier. */
39   if (sequence == FIRST)
40           past_the_last_turn = dynamic_turn_count;
41
```

Figure 23H

```
1    /* If there were any active random variables that we tried to get a set of
2    boundary values for (even if the constraints made the attempt FAIL),
3    remember it. After the loop has been executed completely through all turn
4    items, "remembered_success" will hold the success for the last such
5    attempt to get a set of boundary values. This test is designed to handle the
6    special-case of no active random variables. */
7    if (success != NO_VARS && success != INITIAL)
8            remembered_success = success;
9
10
11   /* If the last set of boundary values for the curr_turn turn item had already
12   been exhausted in a previous call, start backing up to the turn items
13   preceding it, looking for one which has an unused set of boundary values
14   remaining. */
15   if (success == PAST_IT) {
16           direction = REVERSE;
17           group_sequence = NEXT;
18   }
19   else {
20           /* Otherwise, move forward through the turn items, generating a new
21           set of boundary values for each turn item based on its constraints,
22           which may depend on the current values of variables in the first
23           boundarize section above. */
24           direction = FORWARD;
25           group_sequence = FIRST;
26
27           /* If this is the last set of boundary values for the turn item indicated
28           by curr_turn, and all the turn items preceding it have also reached
29           their last sets of boundary values, then update the
30           completion-tracking variable "completed_turn." */
31           if ( (success == OK_LAST || success == NO_VARS) &&
32                            (completed_turn == curr_turn - 1) )
33                   completed_turn += 1;
34   }
35
36
37   if (direction == FORWARD)
38           curr_turn += 1;
39   else
40           curr_turn -= 1;
41
42
43 }   // end of "while" loop
```

Figure 23I

```
1
2
3
4    /* Now we can set past_the_end_turn to its accurate value, no matter what size
5    the associative arrays are, and ignoring any null sub-objects. */
6    past_the_last_turn = last_turn + 1;
7
8
9    /* If the set of boundary values just assigned to the last_turn turn item is the last
10   set of such values (that is, if success == OK_LAST), but any of its predecessors
11   has not yet reached its last set of boundary values, return OK rather than
12   OK_LAST -- we are not yet completely done with generating boundary
13   combinations. */
14   if (success == OK_LAST && completed_turn != last_turn)
15           success = OK;
16
17   /* if success == INITIAL, it means that no method/function was ever called to set
18   any boundary values; this occurs for the highest level of a class hierarchy, which
19   has no sub-objects at that highest level. Returning OK_LAST in the code below
20   makes things work out right for the lower level in the class hierarchy that had
21   called super.boundary (FIRST).
22
23   In the code below, setting completed_turn makes the following call,
24   super.boundary(NEXT), work out right by causing super.boundary(NEXT) to return
25   PAST_IT.
26   */
27   if (success == INITIAL) {
28           completed_turn = last_turn;
29           success = OK_LAST;
30   }
31
32   /* Satisfying this test indicates that the "while" loop never managed to set any
33   boundary values whatsoever. */
34   if (remembered_success == INITIAL)
35           success = NO_VARS;
36   /* satisfying the following test means that last sub-object returned NO_VARS on its
37   boundary call. Since we do not want to characterize the whole instance by this
38   one sub-object, success is replaced by remembered_success. */
39   else if (success == NO_VARS)
40           success = remembered_success;
41
42
```

Figure 23J

```
1    /* post_boundary is designed to automatically invoke super->post_boundary(),
2    thus invoking post_boundary on <instance> one hierarchy level up. The
3    post_boundary invoked at one hierarchy level up will, in turn, recurse up the
4    hierarchy chain to its super->post_boundary(). This recursing up the instance's
5    hierarchy will continue until the post_boundary at all levels of <instance> is
6    executed. */
7    if (do_it == 1) this->post_boundary(sequence);
8
9    /* value returned by "boundary" function is value of success */
10   boundary = success;
11
12   } /* END boundary */
```

Figure 24A

```
1    /* boundary_simple_member_vars sets the random variables, represented by the
2    curr_instance passed to it, to a combination of boundary values according to the
3    "sequence" parameter and according to curr_instance's current state. The current
4    state of curr_instance is determined by the sequence of previous calls to
5    boundary_simple_member_vars. "sequence" is passed the value FIRST or NEXT.
6    The value FIRST is passed in order to reset boundary_simple_member_vars to
7    begin a new sequence.
8
9    boundary_simple_member_vars also returns the following values:
10       FAIL -- if the constraints for curr_instance allow for no possible
11       combinations of values for its random variables.
12
13       OK -- if returns the next available boundary combination of values for the
14       random variables of curr_instance, and there are more boundary
15       combinations available for the current instance.
16
17       OK_LAST -- if returns the next available boundary combination of values for
18       the random variables of curr_instance, and there are no more boundary
19       combinations available for curr_instance.
20
21       PAST_IT -- if already returned the last available boundary combination of
22       values for the random variables of curr_instance, and another boundary
23       combination is requested.
24
25       NO_VARS -- if this instance has no random variables, or if all its random
26       variables have been turned off by rand_mode()
27
28    */
29    boundary_simple_member_vars(sequence, curr_instance)
30    {
31         success = OK;
32         node_sequence = sequence;
33
34         /* If this is first call to boundary_simple_member_vars(), initialize things. */
35         if (sequence == FIRST)
36         {
37
38              /* The following statement is based upon the assumption that, at this
39              point in the execution of the pseudo-code, Individual elements of
40              associative arrays have NOT had do_randomize flag set yet since
41              that happens in modify_assoc_array(). */
```

Figure 24B

```
1    Remove from the list, pointed to by curr_instance->DAG, all DAG
2    nodes with do_randomize FALSE, except those which are individual
3    elements of associative arrays;
4
5    /* Boundary value selection will begin with the first DAG node on the
6    list and move forward through the nodes on the list. */
7    curr_dnode = pointer to first DAG node on curr_instance->DAG;
8    direction = FORWARD:
9
10   /* Keep a marker to show the farthest-along-in-the-list DAG node
11   which has had all its boundary values assigned (or which needs no
12   boundary value – whole-array nodes do not have boundary values
13   themselves). */
14   if (the first DAG nodes in the list are one or more DAG nodes that
15   represent whole arrays)
16           completed_dnode = the last such whole-array node;
17   else
18           completed_dnode = NULL;
19
20   /* Keep track of the end of the list */
21   last_dnode = pointer to last DAG node on curr_instance->DAG with
22   do_randomize TRUE;
23
24   if there is no DAG node with do_randomize TRUE
25           return NO_VARS;
26        }
27
28   else /* sequence == NEXT */
29        {
30           /* If all DAG nodes have already been assigned all boundary values,
31           return PAST_IT. Example: the following "if" statement is satisfied if
32           all the dnodes have only one boundary value and this is the first call
33           to boundary with the sequence parameter set to NEXT after calling
34           boundary with the sequence parameter of FIRST. */
35           if (completed_dnode == last_dnode)
36                   return PAST_IT;
37
38           /* Assume that we will use the next boundary value from the set of
39           boundary values for the last DAG node in the list. If the last
40           boundary value for this node was used during the last call, setting
41           direction to REVERSE will cause the code below to back up through
42           the list of DAG nodes until it finds one where the last boundary value
43           was NOT used yet (it will give that node its next boundary value,
```

Figure 24C

```
1     then proceed forward again through the following nodes, assigning
2     each one its first boundary value).  The "if" testing is for the unusual
3     case where the previous call to boundary_simple_member_vars had
4     run into "success == FAIL" due to unsatisfiable constraints. */
5     if (curr_dnode == NULL)
6     {
7             curr_dnode = last_dnode;
8             direction = REVERSE;
9     }
10  } /* end else sequence == NEXT */
11
12  while (success != FAIL && curr_dnode != NULL)
13  {
14          if (node_sequence == FIRST)
15          {
16                  /* This is where the symbolic representation of an associative
17                  array gets turned into actual nodes for each element based
18                  upon the value of its size-determining expression.  Since its
19                  size-determining expression may include random variables, it
20                  must be evaluated at the right point in the ordered list.  The
21                  individual array elements of the associative array may or may
22                  not be constrained. */
23                  if (curr_dnode points to a DAG node which represents an
24                  entire associative array)
25                  {
26                          /* modify_assoc_array makes sure the correct number
27                          of active array element dnodes are located after the
28                          node representing the entire associative array: if the
29                          current array size is bigger than it's ever been before in
30                          this boundary sequence, then array element dnodes
31                          are added; if the current array size is smaller than on
32                          the previous call to boundary in, then un-needed
33                          dnodes prerrably have their do_randomize flag turned
34                          off.  For purposes of simpler exposition, however, this
35                          pseudo-code presents un-needed dnodes as being
36                          deleted. */
37                          modify_assoc_array( curr_dnode );
38
39                          update last_dnode if it pointed to an element of this
40                          associative array or if it pointed to the whole-array DAG
41                          node itself;
42                  }
43                  else
```

Figure 24D

```
{
    /* When node_sequence == FIRST, the information (if
    any) about what the boundary values are, and about
    which boundary values we have used last, has to be
    cleaned up/removed. The information about what the
    boundary values are is in the set_constraint and eq_val
    as set by evaluate_constraints_for_boundary(), and the
    information about which value was last used (for the
    random variable corresponding to curr_dnode) is
    recorded by curr_dnode->curr_boundary_value_index.
    curr_dnode->curr_boundary_value_index is used by
    set_boundary_value(). */
    clean up any earlier information about boundary values
    for this variable;

/* Whenever curr_dnode appears on the lhs of a
    one_constraint, it had a relop/start_addr pair attached
    to it. Each of these must now be evaluated to produce
    a set of valid ranges of values for the random variable
    represented by curr_dnode. This representation of the
    valid ranges is called a "set constraint" and
    evaluate_constraints_for_boundary concludes by
    setting the set_constraint_field of curr_dnode to point
    to the set constraint data structure it creates. */
    evaluate_constraints_for_boundary(curr_dnode);

/* Now a first boundary value must be assigned from
    one of the valid ranges of curr_dnode's set constraint.
    This assignment may affect the set_constraints of all
    the other nodes further towards the end of DAG list */
    success = set_boundary_value (curr_dnode, FIRST);
    }
} else /* if (node_sequence == NEXT) */
{
    if (curr_dnode points to a DAG node which does not represent
    an entire associative array)
    {
        /* Access boundary value currently assigned to rvar
        corresponding to curr_dnode and find the next
        boundary in set_constraint of curr_dnode and set rvar
        to that. This change to curr_dnode may effect the
```

Figure 24E

```
                    set_constraints of all the other nodes further towards
                    the end of DAG list. */
                    success = set_boundary_value (curr_dnode, NEXT);
          }
} /* end if (node_sequence == NEXT) */

/* If the last boundary value for curr_dnode had already been used in
a previous call, start backing up to its predecessor nodes in the list,
looking for one which has an unused boundary value remaining in
the set. */
if (success == PAST_IT)
{
          direction = REVERSE;
          node_sequence = NEXT;
} else
{
/* Otherwise, move forward through the list, generating a new set of
boundary values for each DAG node based on its constraints, which
may depend on the current values of those DAG nodes which
precede it in the list. */
          direction = FORWARD;
          node_sequence = FIRST;

/* If this is the last boundary value in the set for curr_dnode,
          and all of its predecessors in the list have also reached the
          last boundary values in their sets, then update the completion-
          tracking variable. */
          if (success == OK_LAST && the predecessor of curr_dnode
          == completed_dnode)
                    completed_dnode = curr_dnode;
} if (direction == FORWARD)
          curr_dnode = the DAG node following curr_dnode in the list;
else
          curr_dnode = the DAG node preceding curr_dnode in the list;

}         /* end of "while" */
```

Figure 24F

```
1       /* If the boundary value assigned to last_dnode by set_boundary_value is
2       the last value of the current set constraint (that is, if success == OK_LAST),
3       but any of its predecessors has not yet reached its last boundary values,
4       return OK rather than OK_LAST -- we are not yet completely done with
5       generating boundary combinations. */
6       if (success == OK_LAST && completed_dnode != last_dnode)
7               success = OK;
8
9       return success;
10
11    } /* end boundary_simple_member_vars */
12
13
14    /* evaluate_constraints_for_boundary is very similar to evaluate_constraints for
15    randomize, with two main differences. First, there is no need to maintain weight
16    information, since all boundary values are to be used regardless of their weight.
17    Second, overlapping ranges, within a set_constraint, are merged. For example, a
18    range of values from 1 to 4 overlaps with a range of values from 3 to 5. These two
19    ranges would be merged to the range 1 to 5. This merging means that the
20    boundary values are only 1 and 5, rather than 1, 3, 4 and 5. */
21    evaluate_constraints_for_boundary (dnode)
22    {
23    /* Examples of type_min and type_max for several data types:
24            integer
25                    type_min = most negative signed integer representable in Vera (32
26                    bits)
27
28                    type_max = most positive signed integer representable in Vera (32
29                    bits)
30
31            bit[2:0]
32                    type_min = 0
33
34                    type_max = 7
35
36            (Notice the gaps in the range of values for this enum)
37            enum colors = none, red = 1, green = 2, blue = 4, yellow = 8;
38                    type_min = 0 -- this is the default value for the first enum, "none"
39
40                    type_max = 8
41    */
42    type_min = min value of lhs rvar represented by dnode based on its data type;
43    type_max = max value of lhs rvar represented by dnode based on its data type;
```

Figure 24G

```
1
2    eq_val_flag = 0;
3    user_min = UNDEFINED;
4    user_max = UNDEFINED;
5    set_constraint_flag = NULL;
6    eq_val = NULL;
7    ne_val = NULL;
8    aeq_val = NULL;
9    ane_val = NULL;
10
11   /* This loop steps through all the relop/start_addr pairs of dnode and takes
12   different actions depending upon the relop. One type of relop ("in," "!in" or "dist"), if
13   present as a constraint of dnode, will cause the creation of a set constraint. Only
14   one of these three relops can constrain a single random variable. Other
15   constraints may change the minimum or maximum value of dnode's random
16   variable. Yet other constraints will create lists of values which are not valid for the
17   random variable and therefore represent points at which the ranges of valid values
18   for the random variable must be "split." */
19   for (relop_start_addr_pair = each relop/start_addr pair of
20   dnode->relop_start_addr_list)
21   {
22
23           relop_current = relop of relop_start_addr_pair;
24
25           start_addr_current = start_addr of relop_start_addr_pair;
26
27           rhs_constraint_current = run Vera assembly code at start_addr_current
28           through Vera assembly code interpreter and return pointer to result;
29
30           /* Used for a one_constraint which is a conditional that has returned "void"
31           as its value. In this case, the one_constraint will have no effect on its lhs
32           random variable, so just skip to the next relop/start_addr pair. See Section
33           9.3.3.4 "Void Constraints" of Microfiche Appendix. */
34           if (rhs_constraint_current == VOID_DATA) continue;
35
36           /*
37           if (relop_current == "in") then result returned by Vera assembly code
38           interpreter is already a set of ranges of the necessary form. The result is a
39           pointer to a set_constraint data structure, which is an array of tuples, where
40           each tuple specifies: low end of range, high end of range, weight for the
41           range, apportionment of weight over range (:= or :/).
```

Figure 24H

```
1   To make later processing easier (i.e., avoid need to special case for "in" or
2   "!in" versus "dist") the "weight" is set to 1 for each value of the ranges.
3
4   if (relop_current == "dist") then result returned by Vera assembly code
5   interpreter is already a set of weighted ranges of the necessary form. The
6   result in a pointer to a set_constraint data structure, which is an array of
7   tuples, where each tuple specifies: low end of range, high end of range,
8   weight for the range, apportionment of weight over range (:= or :/).
9   */
10
11  if (relop_current == "!in")
12  {
13          /* Invert the ranges of the set_constraint as returned by Vera
14          assembly code interpreter. As with "in," the "weight" is set to 1 for
15          each value of the ranges. */
16          invert_ranges(rhs_constraint_current);
17  }
18
19  if (relop_current == "in" or "dist")
20  {
21          /* Merge any ranges which overlap, e.g. "1:4" and "3:6" are merged
22          to become "1:6". */
23          merge_overlapping_ranges(rhs_constraint_current);
24  }
25
26  /* create another pointer to set_constraint data structure returned by Vera
27  assembly code interpreter */
28  if (relop_current == "in" "!in" or "dist")
29          set_constraint_current = rhs_constraint_current;
30
31  if (relop_current is "<" "<=" ">" or ">=")
32  {
33          /* The value of rhs_constraint_current returned by Vera assembly
34          interpreter will be number */
35
36          has_inconsistency = update, if appropriate, user_min or user_max
37          based upon whether rhs_constraint_current and relop_current further
38          constrain the already existing value for user_min or user_max;
39
40          /* update also checks for logical inconsistency between these
41          constraint values and returns true if one found */
42          if (has_inconsistency)
```

Figure 24I

```
                    print an error message to user that constraints are logically
                    inconsistent and stop any further processing of randomize
                    method;

/* Example update: Suppose rhs_constraint_current = 5;
                    relop_current = "<" (which means lhs rvar must be <
                    rhs_constraint_current); and current value of user_max = 10.  Since
                    the maximum value of lhs rvar represented by dnode must be less
                    than 5, user_max is updated to be = 4.

Example logical inconsistency: lhs rvar must both be less than 5 and
                    greater than 7 */
          } if (relop_current is "==")
          {
                    /* The value of rhs_constraint_current returned by Vera assembly
                    interpreter will be number */ if (
                              (eq_val_flag != NULL)
                              &&
                              (eq_val != rhs_constraint_current)
                    )
                    print error message to user that constraints are logically
                    inconsistent and stop all further processing of randomize
                    method;

eq_val == rhs_constraint_current;

eq_val_flag = 1;
          } if (relop_current is "!=")
          {
                    /* The value of rhs_constraint_current returned by Vera assembly
                    interpreter will be number */ add value pointed to by rhs_constraint_current to list ne_val;
          } if (relop_current is "=?=")
          {
```

Figure 24J

```
1      /* The value of rhs_constraint_current returned by Vera assembly
2      interpreter will be a bit pattern (which is later converted into a list of
3      numbers). lhs rvar must be equal to one of the numbers represented
4      by this bit pattern. A bit pattern is a specification of the form:
5      <number of bits>'<base><number specification>, as specified in
6      Microfiche Appendix at Sections 3.1.6 and 3.6.1. The <base> can
7      be "b" for binary, "o" for octal or "h" for hexadecimal. This
8      specification represents a bit pattern, as opposed to a literal binary
9      number, because the <number specification> can contain "x" or "z"
10     for various digit positions to represent "don't care" bits. The "=?="
11     operator which operates upon bit patterns of aeq_val is discussed
12     specifically in Section 3.6.1, Microfiche Appendix. */
13
14     add bit pattern pointed to by rhs_constraint_current to list of bit
15     patterns pointed to by "aeq_val";
16  }
17
18  if (relop_current is "!?=")
19  {
20     /* The value of rhs_constraint_current returned by Vera assembly
21     interpreter will be a bit pattern. lhs rvar must not be equal to any one
22     of the numbers represented by this bit pattern. The "!?=" operator
23     which operates upon the bit patterns of ane_val is discussed
24     specifically in Section 3.6.1, Microfiche Appendix. */
25
26     add bit pattern pointed to by rhs_constraint_current to list of bit
27     patterns pointed to by "ane_val";
28
29  }
30
31 } /* end loop over each relop/start_addr pair attached to dnode */
32
33 /* Now all the relop/start_addr pairs of dnode have been evaluated. The results of
34 these evaluation must now be combined to produce a single set constraint data
35 structure which represents all the valid ranges of values for the random variable.
36 This is what is accomplished by the remainder of
37 evaluate_constraints_for_boundary. */
38
39 /* A set constraint data structure may already exist, depending upon what types of
40 operators were specified by the Vera language programmer as constraining this
41 random variable. Even if a set constraint does not already exist, it will be created
42 now. This provides a set constraint "foundation" with which the remainder of
43 evaluate_constraints_for_boundary can work with. */
```

Figure 24K

```
1   if (set_constraint_current == NULL)
2   {
3           /* No operators of type "in" "!in" or "dist" constrain the lhs rvar of dnode.
4           Create a set_constraint from type_min, type_max, user_min and user_max.
5           The apportionment operator in the set_constraint created will be ":=" with
6           each value in the range given a weight of "1." */
7           set_constraint_current = create a set_constraint from type_min, type_max,
8           user_min and user_max;
9   }
10  else
11          adjust existing set_constraint, assigned to set_constraint_current, to be
12          consistent with type_min, type_max, user_min and user_max;
13
14
15  /* Initialize each range of set_constraint_current to have its num_values field set to
16  the number of valid values as indicated by its high_end and low_end. */
17  for (curr_range = each range of set_constraint_current)
18          curr_range->num_values = (curr_range->high_end - curr_range->low_end)
19          + 1;
20
21
22  /* First possible adjustment to set constraint if random variable is constrained by a
23  value it must be equal to. */
24  if (eq_val != NULL)
25  {
26          if (eq_val not within one of the ranges of set_constraint_current)
27                  print error and halt all processing of boundary method;
28
29          /* No further processing necessary since set_boundary_value will just
30          return the eq_val for this dnode. */
31          return;
32  }
33
34
35  /* Second possible adjustment to set constraint if random variable is of the
36  enumerated type. This adjustment is based upon the information stored with the
37  basic variable type, rather than being based upon constraints. */
38  if (lhs rvar of dnode is of type "enum" && the enum values are not all consecutive
39  integers)
40  {
41          enumerated_values = obtain list of permissible values for lhs rvar of dnode;
42
43          for (curr_range = pointer to each range in set_constraint_current)
```

Figure 24L

```
1   {
2       curr_range_intersection = number of enumerated_values that fall
3       within curr_range as specified by curr_range->low_end and
4       curr_range->high_end;
5
6       if (curr_range_intersection == 0)
7           /* curr_range has zero intersection with permissible values of
8           this enumerated type so eliminate curr_range */
9           remove the range from set_constraint_current;
10
11      else
12          /* if intersection between curr_range and enumerated_values
13          is less than the total number of values currently part of
14          curr_range, then curr_range must be split. */
15          if (curr_range_intersection < curr_range->num_values)
16          {
17              curr_range->num_values = curr_range_intersection;
18
19              /* The following loop splits the curr_range into
20              sub_ranges, that is, creates a linked list of the
21              sub_ranges that the curr_range is split into. The
22              pointer sub_ranges of curr_range points to the head of
23              this linked list. A "group" of enumerated_values is
24              defined to be a largest unit of sequential values within
25              enumerated_values. For example, if the
26              enumerated_values are 0, 1, 2, 4, 5, 9 and 10, then
27              there would be the following three groups: (0, 1, 2), (4,
28              5), and (9, 10). */
29              for (curr_group = each group of enumerated_values
30              within curr_range)
31              {
32                  sub_range_curr = create a new sub_range;
33
34                  sub_range_curr->low_end = lowest value of
35                  curr_group;
36
37                  sub_range_curr->high_end = highest value of
38                  curr_group;
39
40                  sub_range_curr->num_values = number of
41                  values in curr_group; /* which is the same as
42                  (sub_range_curr->high_end -
43                  sub_range_curr->low_end) + 1 */
```

Figure 24M

```
1
2                           add sub_range_curr to the linked list
3                           curr_range->sub_ranges;
4                       }
5
6               } /* end if (curr_range_intersection <
7                   curr_range->num_values) */
8
9       } /* end loop for each range in set_constraint_current */
10
11  } /* end if (lhs rvar of dnode is of type "enum") */
12
13
14  /* Third possible adjustment to set constraint if random variable is constrained by
15  values which it cannot be. */
16  if (ne_val != NULL)
17          split ranges of set_constraint_current for each value on ne_val list, with
18          each range having a pointer to its own linked list of sub_ranges it has been
19          split into;
20
21          /* Example of range splitting: Suppose set_constraint_current has a single
22          range of {1; 10; ":="; 1} and ne_val = 5. Then set_constraint_current is
23          altered to point to the following linked list of sub_ranges: {1; 4; ":="; 1} and
24          {6; 10; ":="; 1}. */
25
26
27  /* Fourth possible adjustment to set constraint if random variable is constrained by
28  values which it cannot be. */
29  if (ane_val != NULL)
30  {
31          for (bit_pattern_curr = each bit pattern on ane_val list)
32          {
33                  disallowed_values = list of disallowed numbers which
34                  bit_pattern_curr has been converted into;
35
36                  for (range_curr = each range of set_constraint_current)
37                          split range_curr such that it points to a linked list of
38                          sub_ranges that only contain non-disallowed values, where
39                          the num_values field of each sub_range is set to the number
40                          of values in that sub_range;
41          }
42  }
```

Figure 24N

```
1
2    /* Fifth possible adjustment to set constraint if random variable is constrained by
3    values which it must be equal to. */
4    if (aeq_val != NULL)
5    {
6            for (bit_pattern_curr = each bit pattern on aeq_val list)
7            {
8                    allowed_values = list of allowed numbers which bit_pattern_curr has
9                    been converted into;
10
11                   /* Invert list because it is a simpler algorithm to remove illegal values
12                   than to generate the intersection of two sets of legal values when
13                   one set of values is specified by a bit pattern. */
14                   disallowed_values = invert list of allowed_values;
15
16                   for (range_curr = each range of set_constraint_current)
17                           split range_curr such that it points to a linked list of
18                           sub_ranges that only contain non-disallowed values, where
19                           the num_values field of each sub_range is set to the number
20                           of values in that sub_range;
21           }
22   }
23
24
25   /* Following loop computes a total (called new_range_count), for
26   set_constraint_current, of the total number of sub_ranges in every range which
27   has sub_ranges, plus the total number of ranges without sub_ranges. */
28
29   new_range_count = 0; /* initialize */
30
31   for (curr_range = each range in set_constraint_current)
32   {
33           if (curr_range has no list of sub_ranges)
34                   /* curr_range will correspond to only one range in
35                   new_set_constraint */
36                   new_range_count = new_range_count + 1;
37           else
38           {
39                   /* each sub_range of curr_range will be an entire range in
40                   new_set_constraint */
41                   new_range_count = new_range_count + number of sub_ranges of
42                   curr_range;
43           }
```

Figure 24O

```
1    }
2
3    create new_set_constraint structure, containing new_range_count empty ranges;
4
5    /* Copy ranges and sub_ranges of set_constraint_current to ranges of
6    new_set_constraint. */
7    for (curr_range = each range in set_constraint_current)
8    {
9            if (curr_range has no linked list of sub_ranges)
10                   copy curr_range to the next empty range element in the
11                   new_set_constraint;
12           else
13                   for (curr_sub_range = each sub_range in the linked list of
14                   curr_range)
15                   {
16                           copy the curr_sub_range to the next empty range element in
17                           the new_set_constraint;
18                   }
19   } /* end for each range in set_constraint_current */
20
21   set dnode to have its set_constraint_field point to new_set_constraint;
22
23   } /* end evaluate_constraints_for_boundary */
24
25
26   /* set_boundary_value sets a random variable, represented by the curr_dnode
27   passed to it, to a boundary value of its set_constraint_field according to the
28   node_sequence parameter.  node_sequence is passed the value FIRST or NEXT.
29
30   set_boundary_value also returns the following values:
31           FAIL -- if the constraints for curr_dnode, in conjunction with the current
32           values of any random variables curr_dnode depends on, allow for no
33           possible values for the random variable represented by curr_dnode.
34
35           OK -- if returns the next available boundary value for curr_dnode, and there
36           are still more boundary values available for curr_dnode.
37
38           OK_LAST -- if returns the next available boundary value for curr_dnode,
39           and there are no more boundary values available for curr_dnode.
40
41           PAST_IT -- if already returned the last available boundary value for
42           curr_dnode, and another boundary value is requested.
43   */
```

Figure 24P

```
1   set_boundary_value (curr_dnode, node_sequence)
2   {
3           /* If random variable has been constrained to a single valid value, then it's
4           easy just to pick that single value! */
5           if (eq_val was set by evaluate_constraints_for_boundary for this dnode)
6           {
7                   if (node_sequence == FIRST)
8                   {
9                           use that eq_val to set value of *(dnode->rvar_pointer);
10                          return OK_LAST;
11                  }
12                  else
13                          return PAST_IT;
14          }
15
16          /* If the constraints, using the current boundary values for random variables
17          that curr_dnode's random variable depends on, allowed no possible values,
18          return FAIL.
19
20          number_of_boundary_values steps through all the ranges in the
21          set_constraint passed to it and finds the total number of unique boundary
22          values. If a range has low_end == high_end, then, for example, that range
23          only adds "1," rather than "2," to the total computed by
24          number_of_boundary_values.
25
26          Rather than utilizing number_of_boundary_values as a function, it may be
27          preferrable to store it as a separate field of the DAG node data structure. */
28          if (number_of_boundary_values(curr_dnode->set_constraint_field) == 0)
29                  return FAIL;
30
31          if (node_sequence == FIRST)
32                  /* Note that curr_boundary_value_index keeps track of where
33                  boundary is in utilizing the list of boundary values for curr_dnode. */
34                  curr_dnode->curr_boundary_value_index = 1;
35          else
36                  curr_dnode->curr_boundary_value_index =
37                  curr_dnode->curr_boundary_value_index + 1;
38
39          if (curr_dnode->curr_boundary_value_index >
40          number_of_boundary_values(curr_dnode->set_constraint_field))
41                  return PAST_IT;
42
```

Figure 24Q

```
1      set value of *(dnode->rvar_pointer) to the boundary value of
2      curr_dnode->set_constraint_field indexed by
3      curr_dnode->curr_boundary_value_index;
4
5      if (curr_dnode->curr_boundary_value_index ==
6      number_of_boundary_values(curr_dnode->set_constraint_field))
7              return OK_LAST;
8      else
9              return OK;
10  } /* end set_boundary_value */
11
12
13  /* Due to constraints on specific array elements, or due to earlier boundary() calls
14  which added all the associative array elements, there may already be DAG nodes
15  for elements of this associative array. If not, they are added. Note that if the size
16  of the associative array depends on random variables, the size of the associative
17  array now may be greater or smaller than during earlier boundary() calls. If the
18  array size now is smaller than on a previous call, the DAG nodes for any array
19  elements with indices larger than the current array size must be deleted. For
20  performance reasons, it may be preferable to set the do_randomize flag to OFF for
21  these elements rather than delete them, in which case a small amount of
22  modification to boundary_simple_member_vars is required. */
23  modify_assoc_array ( array_dnode )
24  {
25          /* Due to the ordered list, all random variables, necessary for evaluating the
26          expression which determines the number of elements to generate boundry
27          values for, are available */
28          start_addr = get start_addr for Vera assembly code which evaluates
29          expression on rhs of assoc_size;
30
31          size = result of evaluating the Vera assembly code at start_addr;
32
33          /* Array element nodes created by this loop will be evaluated in subsequent
34          iterations of the enclosing "for" loop since these nodes are inserted in the
35          ordered list after the node indicated by array_dnode. In this case, the node
36          indicated by array_dnode represents the entire associative array. */
37          for (i = 0 to (size - 1) )
38          {
39                  /* This check is necessary since specific elements of the associative
40                  array may have constraints and have therefore already been
41                  created. These specific elements are guaranteed to be located after
42                  array_dnode, but whole portion of ordered array after array_dnode
43                  needs to be searched. */
```

Figure 24R

```
1   if (ordered list does not already contain a node representing the ith
2   element of the associative array indicated by array_dnode) {
3       if (ith element of associative array indicated by array_dnode
4       has not been turned OFF by rand_mode()) {
5           /* It is preferable to add the nodes representing
6           elements of the associative array, after the node
7           symbolically representing the entire array, such that
8           they are in ascending order based upon their array
9           index, to allow faster search termination. */
10          add a node representing the ith element to the ordered
11          list after the node indicated by array_dnode;
12          set do_randomize TRUE for the new node;
13      }
14  }
15  else { /* if list already contained a node for the array element */
16      if (ith element of associative array indicated by array_dnode
17      has not been turned OFF by rand_mode())
18          set do_randomize TRUE for that element's node;
19      else
20          remove that element's node from the list;
21  }
22  } /* end for (i = 0 to (size – 1) ) */
23
24  /* Now remove any individual assoc. array elements with index greater than
25  the current assoc_size of the array. */
26  for (each DAG node from array_dnode to the end of the list)
27  {
28      if (DAG node is an element of this assoc. array with index >= size)
29          remove the node from the list
30  }
31  }
```

METHOD AND APPARATUS FOR RANDOM STIMULUS GENERATION

This is a continuation, entitled to benefit under 35 U.S.C. 120, of the following U.S. Patent herein incorporated by reference:

"Method and Apparatus For Random Stimulus Generation," issued Apr. 22, 2003 with U.S. Pat. No. 6,553,531 and having inventors Won Sub Kim, Mary Lynn Meyer and Daniel Marcos Chapiro.

Application Ser. No. 09/344,148 filed Jun. 24, 1999, is itself a continuation in part, entitled to benefit under 35 U.S.C. 120, of the following three U.S. Patents:

U.S. Pat. No. 6,513,144, "Method and Apparatus For Random Stimulus Generation," filed on Apr. 22, 1999, having inventors Won Sub Kim, Mary Lynn Meyer and Daniel Marcos Chapiro, filed with McDermott, Will & Emery having U.S. patent Ser. No. 09/298,984;

U.S. Pat. No. 6,499,127, "Method and Apparatus For Random Stimulus Generation," filed on Apr. 22, 1999, having inventors Won Sub Kim, Mary Lynn Meyer and Daniel Marcos Chapiro, filed with McDermott, Will & Emery having U.S. patent Ser. No. 09/298,986; and U.S. Pat. No. 6,449,745, "Method and Apparatus For Random Stimulus Generation," filed on Apr. 22, 1999, having inventors Won Sub Kim, Mary Lynn Meyer and Daniel Marcos Chapiro, filed with McDermott, Will & Emery having U.S. patent Ser. No. 09/298,981.

CROSS REFERENCE TO RELATED APPLICATIONS

This application is related to the following five U.S. patents, all of which are herein incorporated by reference:

U.S. Pat. No. 6,493,841, "Method and Apparatus For Determining Expected Values During Circuit Design Verification," filed on Mar. 31, 1999, with inventors Won Sub Kim, Valeria Maria Bertacco, Daniel Marcos Chapiro and Sandro Pintz, having McDermott, Will & Emery U.S. patent Ser. No. 09/283,774;

U.S. Pat. No. 6,427,223, "Method and Apparatus For Adaptive Verification Of Circuit Designs," filed on Apr. 30, 1999, with inventors Won Sub Kim, John Harold Downey and Daniel Marcos Chapiro, having McDermott, Will & Emery U.S. patent Ser. No. 09/303,181;

U.S. Pat. No. 6,513,144, "Method and Apparatus For Random Stimulus Generation," filed on Apr. 22, 1999, with inventors Won Sub Kim, Mary Lynn Meyer and Daniel Marcos Chapiro, having McDermott, Will & Emery U.S. patent Ser. No. 09/298,984;

U.S. Pat. No. 6,499,127, "Method and Apparatus For Random Stimulus Generation," filed on Apr. 22, 1999, with inventors Won Sub Kim, Mary Lynn Meyer and Daniel Marcos Chapiro, having McDermott, Will & Emery U.S. patent Ser. No. 09/298,986;

U.S. Pat. No. 6,449,745, "Method and Apparatus For Random Stimulus Generation," filed on Apr. 22, 1999, with inventors Won Sub Kim, Mary Lynn Meyer and Daniel Marcos Chapiro, having McDermott, Will & Emery U.S. patent Ser. No. 09/298,981.

This application is related to the following abandoned U.S. patent application, herein incorporated by reference:

"Method and Apparatus For Object-Oriented Verification Monitoring of Circuit Designs," filed on Apr. 30, 1999, with inventors Won Sub Kim, John Harold Downey and Daniel Marcos Chapiro, having McDermott, Will & Emery U.S. patent Ser. No. 09/303,801.

FIELD OF THE INVENTION

The present invention relates generally to the generation of random test data, and more particularly to the generation of such test data as part of a verification programming language.

BACKGROUND OF THE INVENTION

Random test data has a wide variety of uses. A particularly important application of random test data is in the verification of digital electronic circuits in order to exercise a wide variety of circuit paths for possible faults.

To tackle the increasing complexity of integrated digital electronic circuits, designers need faster and more accurate methods for verifying the functionality and timing of such circuits, particularly in light of the need for ever-shrinking product development times.

The complexity of designing such circuits is often handled by expressing the design in a high-level hardware description language (HLHDL). The HLHDL description is then converted into an actual circuit through a process, well known to those of ordinary skill in the art as "synthesis," involving translation and optimization. Typical examples of an HLHDL are IEEE Standard 1076-1993 VHDL and IEEE Standard 1364-1995 Verilog HDL, both of which are herein incorporated by reference.

An HLHDL description can be verified by simulating the HLHDL description itself, without translating the HLHDL to a lower-level description. This simulation is subjected to certain test data and the simulation's responses are recorded or analyzed.

Verification of the HLHDL description is important since detecting a circuit problem early prevents the expenditure of valuable designer time on achieving an efficient circuit implementation for a design which, at a higher level, will not achieve its intended purpose. In addition, simulation of the design under test (DUT) can be accomplished much more quickly in an HLHDL than after the DUT has been translated into a lower-level, more circuit oriented, description.

The verification of HLHDL descriptions has been aided through the development of Hardware Verification Languages (or HVLs). Among other goals, HVLs are intended to provide programming constructs and capabilities which are more closely matched to the task of modeling the environment of an HLHDL design than are, for example, the HLHDL itself or software-oriented programming languages (such as C or C++). HVLs permit a DUT, particularly those DUTs expressed in an HLHDL, to be tested by stimulating certain inputs of the DUT and monitoring the resulting states of the DUT.

SUMMARY OF THE INVENTION

The present invention adds to Vera capabilities which facilitate the generation of random test data.

In an analogy to classical signal-processing models, Vera provides a "source" of data (random number generation) and the facilities for designing a series of "filters" (constraints) to transform that data into a form which provides adequate testing.

Sources of random numbers are easily produced by simply adding the randomness attribute "rand" or "randc" to a variable declaration of a class definition. Such variables with a randomness attribute are referred to as "random variables."

Adding a randomness attribute to a variable declaration permits a class instance containing the variable to make meaningful use of the "randomize" method for the generation of random values for those declared variables. A randomize method call causes any random variables of an instance to have a randomly generated value (or values) assigned.

The randomness attribute can be applied to user-defined sub-objects of an instance, as well as to built-in data types. The randomness attribute can be applied to arrays of fixed size or to "associative arrays" of undeclared size.

The values assigned to random variables are controlled using "constraint blocks," which are part of the class definition. A constraint block is comprised of constraint_expressions, where each constraint_expression limits the values which can be assigned to a random variable which is on the left-hand-side (lhs) of the constraint_expression. The right-hand-side (rhs) of a constraint_expression, in conjunction with a relational operator, is used to derive a range or ranges of permissible values for the lhs random variable.

The introduction of constraint blocks in a class definition permits instances of that class to make meaningful use of the "constraint_mode" method. Initially, all constraint blocks of an instance are active or ON, meaning that all the constraint_expressions within the block will act to constrain their lhs random variables. constraint_mode can be used to turn ON or OFF any or all constraint blocks of an instance. A constraint block which is OFF means that all of its constraint_expressions will not act to constrain their lhs random variables.

A constraint_expression can constrain any random variable which has been declared at its level in the class hierarchy, or at any higher level. A constraint_expression cannot constrain a random variable declared at a lower level in the hierarchy. Lower level classes inherit variables and methods from higher level classes.

A single random variable can be constrained by zero or more constraint_expressions, each of which may be in a different constraint block and at a different class hierarchy level. A single random variable may not be constrained by constraint_expressions, however, which present logically inconsistent constraints. Such logical inconsistencies are checked for while performing the randomize method since such "inconsistencies" may dynamically appear, and disappear, under program control. For example, inconsistencies may appear and disappear depending upon which constraint blocks have been enabled with the constraint_mode method. Other possibilities, for controlling the existence of inconsistencies, are values assigned to other random variables during the execution of randomize method, as well as the values assigned to non-random variables before randomize is begun.

Because random variables may appear on the rhs of a constraint_expression, the following complications are handled. A constraint_expression with rhs random variables means that the lhs random variable of the expression "depends on" the rhs random variables for the value which may be chosen. Therefore, there is an implicit ordering in which values must be assigned to random variables: the rhs random variables must be assigned their random values first such that the constraints, which limit the permissible values for the lhs random variable, can be determined. This ordering may continue through several constraint_expressions, since the rhs random variables of one constraint_expression may themselves be lhs random variables of other constraint_expressions which also have random variables on their rhs.

The dependency, of one random variable upon the prior assignment of other random variables, is expressed by means of a directed acyclic graph (or DAG). It is syntactically possible to define a cyclic dependency between random variables—such cyclic dependencies are detected during DAG construction and are not permitted.

In order to perform the randomize method, a linear ordering must be derived from the DAG or DAGs which may be constructed. The linear ordering is derived such that each random variable is not assigned a value until all random variables which it depends upon (directly or indirectly) for constraining its permissible values have already been assigned values.

The randomize method operates by evaluating the constraint_expressions which are ON according to the linear ordering. For a particular lhs random variable, call it random variable X, its constraint_expressions are translated into a set_constraint structure which we shall call Y.

The set_constraint structure Y consists of tuples, called ranges, which specify the valid values which the random variable X can assume. These ranges also have weights associated with them which indicate the relative probability with which a value for X should be selected from that range. The selection of a random value for X, from its set_constraint Y, is basically a two-step process. First, a range within set_constraint Y is randomly chosen, where the likelihood of choosing a particular range is increased by its weight value. Secondly, within the range selected a particular value is randomly selected.

The boundary method operates similarly to the randomize method in that it evaluates the constraint_expressions which are ON according to the linear ordering. For a particular lhs random variable, call it random variable X, its constraint_expressions are translated into a set_constraint structure which we shall call Y.

The set_constraint structure Y consists of tuples, called ranges, which specify the valid values which the random variable X can assume. For boundary, unlike randomize, the weights of these ranges are ignored. The selection of a value for X, from its set_constraint Y, is also performed for boundary according to a different process than utilized in randomize.

Rather than selecting a value for each random variable X from a random point within one of its ranges, as done for randomize, the purpose of boundary is to sequentially select a combination of boundary values, with each boundary value being chosen from a different random variable and the value chosen for each random variable being limited to the boundary values of its ranges which comprise its set_constraint structure. Each range of a set_constraint is defined by a low and a high value; these low and high values of all ranges are the boundary values which the boundary method is limited to selecting. By selecting a boundary value for each random variable of the instance, in a coordinated fashion, all combinations of boundary values can be produced through successive calls to the boundary function. As with randomize, since random variables may depend upon each other, the selection of a boundary value for one random variable may change the selection of boundary values available for other random variables.

Advantages of the invention will be set forth, in part, in the description that follows and, in part, will be understood by those skilled in the art from the description or may be learned by practice of the invention. The advantages of the invention will be realized and attained by means of the elements and combinations particularly pointed out in the appended claims and equivalents.

BRIEF DESCRIPTION OF THE DRAWINGS

The accompanying drawings, that are incorporated in and constitute a part of this specification, illustrate several embodiments of the invention and, together with the description, serve to explain the principles of the invention. FIGS. 17 to 24 are written in a pseudo-code that is loosely based upon the C and C++ programming languages:

FIG. 1 shows the general syntactic structure of a class definition, in accordance with the present invention;

FIG. 2 depicts the general syntactic structure for declaring random variables, in accordance with the present invention;

FIG. 3 illustrates the general syntactic structure for declaring an associative array, in accordance with the present invention;

FIG. 4 shows methods which are used in conjunction with random variables;

FIG. 5 depicts the general syntactic structure for declaring a constraint block as part of a class definition;

FIG. 6 shows the general syntactic structure for declaring a constraint_expression as part of a constraint block declaration;

FIG. 7 shows methods which are used in conjunction with constraint blocks;

FIG. 9 illustrates the general structure of a record for representing a single level of the class hierarchy for an instance;

FIG. 10 illustrates the general structure of a record for representing a constraint block within a hierarchical class instance;

FIG. 11 depicts the general structure of a record for representing a constraint_expression within record for representing a constraint block;

FIG. 12 depicts the general structure of a record for representing a constraint block, as applied to the particular situation of representing associative arrays;

FIG. 13 depicts the general structure of a record for representing a constraint_expression, as applied to the particular situation of representing an associative array;

FIG. 14 shows the general structure representing a DAG node;

FIG. 15 shows the general structure of a set_constraint structure for representing the valid potential values for a random variable;

FIG. 17 contains a description of the randomize method for assigning random values to random variables of an instance;

FIG. 18 contains a description of the build_dag function, utilized by the randomize method, which constructs a directed acyclic graph (DAG) of certain of the random variables declared for an instance;

FIG. 19 contains a description of the linearize_dag function, utilized by the randomize method, which linearizes the DAGs representing the random variables declared for an instance;

FIG. 20 describes the include_ON_rvars function, utilized by the randomize method, which ensures that the appropriate random variables are included in the DAG and have a flag set to indicating that they should receive a random value;

FIG. 21 describes the randomize_simple_member_vars function, utilized by the randomize method, which assigns a random value to each flagged node of the DAG;

FIG. 22 depicts the constraint_mode method, utilized for controlling constraint blocks in accordance with the present invention;

FIG. 23 illustrates the boundary method for assigning combinations of boundary values to random variables of an instance; and FIG. 24 illustrates the boundary_simple_member_vars function, utilized by the boundary method, which assigns a combination of boundary values to each flagged node of the DAG.

BRIEF DESCRIPTION OF PRINTED APPENDICES

Figure 8:
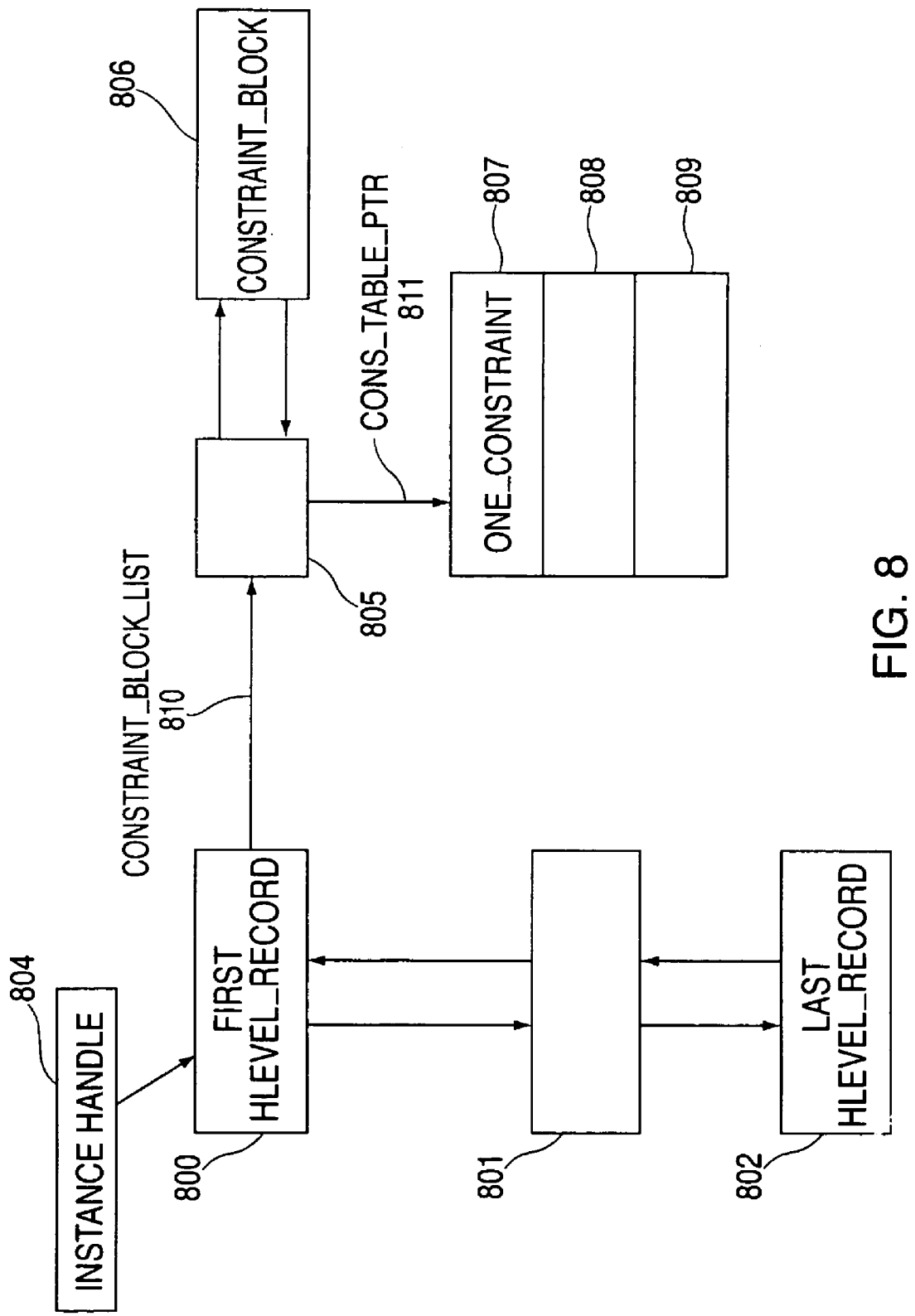
FIG. 8 depicts the general structure of an exemplary hierarchical class instance.

The accompanying printed appendix numbered 9, that is incorporated in and constitutes a part of this specification, illustrates several embodiments of the invention and, together with the description, serves to explain the principles of the invention:

Appendix 9, Vera 4.0 User's Manual, 429 pages.

DETAILED DESCRIPTION OF PREFERRED EMBODIMENTS

Reference will now be made in detail to preferred embodiments of the invention, examples of which are illustrated in the accompanying drawings. Wherever possible, the same reference numbers will be used throughout the drawings to refer to the same or like parts.

1. Overview Re Verilog and Vera

The present invention relates to an HVL known as the Vera Verification System language from Systems Science Inc., Palo Alto, Calif. (which is now part of Synopsys, Inc., Mountain View, Calif., U.S.A.), hereinafter referred to as the "Vera language." A comprehensive presentation of the Vera language, and its capabilities, is presented in the Vera User's Manual which is included in the present patent as an Appendix 9. As part of the verification process described above, a program written in the Vera language models the environment of the DUT by producing the test data or signals to which the DUT is subjected as well as recording or analyzing the DUT's responses. A Vera language model can be used to test any kind of DUT, provided that the appropriate interface is provided. Vera is primarily utilized, at present, with DUTs that are modeled in the Verilog HDL language (hereinafter referred to as the "Verilog language") and are being executed on an event-driven simulator. However, a Vera model could be utilized with a DUT expressed in other languages and executed on other event-driven or cycle-driven simulators. For example, the DUT could be expressed in the VHDL language. The DUT which the Vera language program is testing need not even be a software simulation. For example, the DUT to be tested could be emulated in hardware, or could even be an actual integrated circuit.

The primary usage of the Vera language, that being its usage in conjunction with an event-driven Verilog-modeled DUT, interfaces and synchronizes with a DUT as follows. This general topic of interfacing and synchronization is also discussed in Appendix 9, Chapter 1.

The Verilog simulator and the Vera simulator are both event-driven simulators that run in a synchronized fashion which may be described as a very efficient form of co-simulation. The Verilog simulator executes a Verilog language model of the hardware device under test (DUT) while the Vera simulator executes a Vera language model of the environment in which the DUT is to be tested. As an environment simulator, the basic functionality of the Vera simulator is to stimulate the DUT by driving certain of its inputs and to monitor the resulting states of the DUT by sampling the values of its nodes.

The Vera simulator implements the Vera language in the following manner. The Vera language is a high-level object-oriented programming language. Programs written in the Vera language are first compiled into lower-level instructions in Vera assembly code. These Vera assembly code instructions are interpreted by the C or C++ routines which comprise the Vera simulator.

The co-simulation is started from the Verilog simulator side since, according to the present embodiment, the Verilog simulator is the main program started by the user and the Vera simulator is a special application which has been linked into Verilog through Verilog's interface for the high-level software-oriented programming languages of C or C++. The Verilog simulator may be any one of a variety of conventional Verilog simulators, such as Verilog-XL produced by Cadence Design Systems of San Jose, Calif. At certain carefully controlled points in time, to be described in more detail below, the Verilog simulation is halted and the Vera simulation is run in a non-preemptive fashion.

Specifically, the Verilog simulator has a programming language interface (PLI) which allows applications written in C or C++ to communicate with the device under test (DUT) as modeled in the hardware-oriented language of Verilog. An example of such an application, that is written in C or C++, is the Vera simulator. The PLI has the following specific features. It permits Verilog language procedures to call specific C or C++ procedures. It permits C or C++ procedures (such as those which implement the Vera simulator) to establish certain nodes of the Verilog model as "callback" nodes. Whenever a node in Verilog, marked as a callback node, changes in value a specific C or C++ procedure or procedures are called. The PLI further permits C or C++ procedures to insert, at a specific time slot in the event queue of the Verilog simulator, a callback to a specific Vera procedure. In addition, the PLI provides functions through which Vera language programs can both examine the value of certain nodes in the Verilog simulation and set the value of certain Verilog nodes. While PLI functions permit Vera to immediately examine the value of certain Verilog nodes, the setting of Verilog nodes becomes a scheduled event in Verilog which is actually performed when Verilog is restarted.

The specifics of the Verilog/Vera co-simulation, and its utilization of the PLI functions described above, are as follows.

The Verilog language module first started, when the user begins the Verilog simulation, is called "vshell." vshell calls the Vera simulator procedure "vmc_init" through the PLI. vmc_init performs the following five major functions: i) it loads the Vera assembly language program to be executed by the Vera simulator, ii) it sets up certain nodes of the Verilog model as callback nodes, iii) it creates a "master" context of level 0, which we shall also refer to as "context(0)," for the execution of the main Vera language program, iv) it places context(0) on "the run queue" of the Vera simulator which holds all Vera language contexts waiting to be run and v) it calls "vera_main," the main routine of the Vera simulator. The nodes which vmc_init establishes as callback nodes in step (ii) are typically: i) the Verilog model's system clock, and ii) those clocks specified by Vera language interface statements.

The Vera interface statement is a programming construct by which certain signals in the Vera model (which we shall refer to as "data" signals) are connected to certain signals in the Verilog model (which we shall also refer to as "data" signals), and the communication of information between the two models is synchronized with a single signal of the Verilog model that is defined as the clock signal for that particular interface. A Vera language program may contain multiple interfaces and each interface may have a different signal selected as its clock. If an interface does not specify a clock, then the Verilog system clock is utilized by default. In addition to specifying a clock, the interface statement specifies the particular edge (positive or negative) of the clock upon which each data signal of the interface is to be driven or observed. In addition, the interface can specify a certain skew time, before the selected edge of the interface's clock, at which each data signal is to be observed by Vera. The interface can also specify each data signal as being driven by Vera a certain skew time after the selected edge of the interface's clock.

The direct call by vmc_init to vera_main, rather than starting the Verilog simulation, is necessary since there may be instructions in the Vera language program that vera_main can execute before any clock events have occurred in the Verilog simulation. vera_main always begins by performing the following two major operations: i) checking the queue of contexts waiting to be executed for any contexts which, in light of the clock edge which has just occurred to cause vera_main to be called, should now be transferred to the run queue, and ii) running, in turn, each context on the run queue.

At this early point in the co-simulation's execution, the wait queue will be empty but the run queue will have the main Vera language context, context(0), created by vmc_init. context(0) will execute until it reaches a Vera construct which requires a clock edge which has not occurred yet. It is significant to note that context(0) may fork off one or more sub-contexts, which we shall refer to as context(1), context (2), . . . . Each of these sub-contexts is also put on the run queue and executed until a clock edge, which has not yet occurred, is required. As each context is executed as far as it can be, without a further clock edge occurring, the context is moved from the run queue to the wait queue with a notation as to the clock edge it requires before it can continue execution. When the run queue is finally empty of contexts to execute, vera_main returns control to vmc_init. vmc_init returns control to vshell and vshell starts the main Verilog language module that is modeling the DUT.

The Verilog modules modeling the DUT execute until a change occurs to a clock node which causes the calling of a callback procedure of Vera. The Verilog system clock node preferably has its own first callback procedure, independent of a second callback procedure shared by all other clock nodes as specified in Vera interface statements. This separation into two callback procedures is done in order to improve the speed of callback processing. Each of these callback procedures, however, operates as follows. First, the callback procedure determines whether the clock edge which caused the procedure to be called is of the right type (either positive or negative) for any data signal of any interface statement it serves as clock signal for. If the clock edge is of the right type for any data signal of any interface statement to which the clock is connected as the clock of that interface statement, then the callback procedure inserts into the Verilog event queue, at the time step immediately following the time step in which the callback procedure was called, a PLI call to vera_main which also contains an indication of the Verilog clock signal which changed, and the nature of the transition (positive or negative). The callback procedure then returns control to the Verilog modules simulating the DUT which will continue processing any events at the current time step of the Verilog event queue. Assuming that the callback procedure inserted a PLI call to vera_main, as soon as all events in the event queue at the current Verilog time step are exhausted, the inserted call to vera_main is executed.

When vera_main is called, through a PLI call inserted in the Verilog event queue, the clock and transition it represents is checked against the contexts waiting for a clock transition in the wait queue. As discussed above for vera_main, it will compare those contexts which are waiting to the particular clock transition which produced this call and will transfer to the run queue those contexts which are now satisfied. Each context in the run queue is then executed until all contexts have been executed as far as they can without a new clock edge and are either: i) finished, or ii) back on the wait queue. If a skew has been specified in the interface statement for data signals being used by a context, that skew is accomplished during the running of the contexts as follows. Data signals which are to be observed by Vera a certain skew time before the clock edge are observed through a delay device at the time of the clock edge. Data signals which are to be driven by Vera a certain skew time after the clock edge are driven through a delay device at the time of the clock edge. Once the run queue is empty, control is returned to the Verilog simulation at the point just after the inserted PLI call to vera_main.

While most Verilog/Vera communication is typically synchronized through interface statements as described above, there are two additional forms of synchronization: i) a Vera language specification that the Verilog simulation call the Vera simulation at some particular point in time of the Verilog simulation, and ii) a Vera language specification that the Verilog simulation call the Vera simulation upon a specified asynchronous transition of a specified signal, independent of any other clock signal. Each of these two additional forms of synchronization is handled by an additional callback procedure, in addition to the two callback procedures discussed above. As with the callback procedures discussed above, this division into two additional callback procedures is done in order to increase the speed of callback processing. Both of these two additional forms of Verilog/Vera synchronization are accomplished by having vmc_init perform some additional operations during step (ii) of the five major vmc_init functions described above. With regard to each call to Vera at a Verilog time, vmc_init through the PLI inserts in the event queue of Verilog, at the appropriate point in time, a call to a third callback procedure which is optimized for handling this type of callback situation. This third callback procedure inserts into the Verilog event queue, at the time step immediately following the time step in which the third callback procedure was called, a PLI call to vera_main which also contains an indication of the time step at which Verilog has arrived. The callback procedure then returns control to the Verilog modules simulating the DUT which will continue processing any events at the current time step of the Verilog event queue before the inserted call to vera_main is executed. vera_main will then check the time passed to it against any contexts which are waiting for that time to occur before executing. vera_main will continue executing various contexts until the run queue becomes empty, at which point control is returned to the Verilog simulation at the point just after the inserted PLI call to vera_main. With regard to the asynchronous Vera call, vmc_init through the PLI sets up these asynchronous nodes as calling a fourth callback procedure. This fourth callback procedure investigates whether the transition which has occurred is the one sought for by a particular Vera language statement and if so, inserts into the Verilog event queue, at the time step immediately following the time step in which the fourth callback procedure was called, a PLI call to vera_main which also contains an indication of the node which has changed and the transition type. The callback procedure then returns control to the Verilog modules simulating the DUT which will continue processing any events at the current time step of the Verilog event queue before the inserted call to vera_main is executed. vera_main will then check the asynchronous transition indication passed to it against any contexts which are waiting for that transition to occur before executing. vera_main will continue executing various contexts until the run queue becomes empty, at which point control is returned to the Verilog simulation at the point just after the inserted PLI call to vera_main.

2. Vera Language Programming and Stimulus Generation

Vera is a language which supports a programming style known as Object-Oriented Programming (or OOP). It is a programming language in which classes, and hierarchies of classes, can be defined. A class defines both variables (also known as properties) and methods which operate upon those variables. Instances of a class are pointed to by handles and instances are created by functions known as constructors. These basic principles of OOP are well-known. How these principles operate within the Vera language are discussed in Appendix 9.

In particular, Chapter 8 introduces OOP in Vera, which needs to be read in conjunction with the other Chapters describing the Vera language. For example, methods in Vera (also referred to as subroutines) are discussed in Section 4.6 of Appendix 9. In Vera, subroutines are of two types: functions (which return a value) and tasks (which do not return a value). The built-in data types, of which variables can be declared, are covered in Chapter 3 of the Appendix 9. FIG. 1 depicts the basic syntactic structure for a class definition. Note that elements of the definition surrounded by angle-brackets ("<" and ">") specify meta-variables which are to be filled in with particular information of the type described between the angle-brackets. Elements of the definition surrounded by square-brackets ("[" and "]") are optional. Therefore, in FIG. 1, "extends" is only necessary if <class name> is a child class of some <parent class>.

The present invention adds to Vera capabilities which facilitate the generation of random data. These Vera capabilities, and their programming language constructs, are discussed in Chapter 9 of Appendix 9 entitled "Automated Stimulus Generation." Within the class definition framework of FIG. 1, these additional capabilities augment the <variable declarations> and add a new area of the class definition shown as <constraint blocks>. Such random data would typically be used as stimulus for a DUT. The principles of the present invention can be applied, however, in any application where it is useful to have random data which can be constrained to be within certain parameters and/or have certain characteristics. Other programming language constructs and capabilities of the Vera language are used to sample the DUT's responses and to evaluate whether the DUT is functioning correctly. Some of Vera's other capabilities for monitoring and evaluation are discussed in Chapters 4 and 11 of Appendix 9.

In an analogy to classical signal-processing models, Vera provides a "source" of data (random number generation) and a series of "filters" (constraints) to transform that data into a form which provides adequate testing. These constructs, which collectively provide a facility which we shall also refer to as "constrained random number generation," are focused upon in Section 9.3 of the Appendix 9. In addition to providing for random data generation, Vera also has constructs to permit the "packing" and "unpacking" of data within an object. Such pack and unpack facilities (which are focused upon in Section 9.4 of Appendix 9) are often useful in testing a DUT with packets that need to be sent and/or received via serial bit streams.

Sources of random numbers are easily produced by simply adding the attribute "rand" or "randc" to a variable declaration of a class definition. This is depicted in FIG. 2. We will also refer to the "rand" or "randc" attributes, collectively, as a "randomness attribute." Variables to which such a randomness attribute has been added shall also be referred to as "random variables." The syntax and detailed meaning of these attributes are discussed in Section 9.3.1 of the Appendix 9. Adding the "rand" or "randc" attribute to a variable declaration permits a class instance to make meaningful use of certain methods for the generation of random values for that variable. These methods, to be discussed below, are: "randomize," "rand_mode" and "boundary." The invocation of these two methods is shown in FIG. 4. These methods are added to all class definitions, whether they contain a random variable declaration or not, to ensure that these methods perform properly within the various class hierarchies that may be formed.

Randomize is discussed in Section 9.3.2 of Appendix 9. Consider a handle to a class instance, which we shall refer to as <instance> (and which is also referred to in Appendix 9 as an "object_name"). The method call "<instance>.randomize ( )" causes any variables of that instance, with either a rand or randc attribute, to have a randomly generated value assigned.

While the randomness attribute of a random variable is initially active, meaning for example that a randomize method call will assign it a random value, this attribute can be switched either OFF or ON under program control. This switching of the randomness attribute is accomplished with the method "rand_mode" whose meaning and syntax is discussed in detail in Section 9.3.1.2 of Appendix 9. rand_mode can also be used to determine whether the randomness attribute of a particular random variable is ON or OFF with the REPORT parameter as shown in FIG. 4.

As discussed in Section 9.3.1 of Appendix 9, the randomness attribute can be added to variables of type: integer, bit, enumerated, and object (which we shall refer to as a "sub-object" or "nested object"). A sub-object is a declaration that another user-defined class (rather than a built-in primitive data type) be instantiated as a variable of a class definition. The randomness attribute can be applied to arrays of type: integer, bit, enumerated or sub-object. If the array is associative (meaning that its size is unspecified), then the range of the array to which the randomness attribute will apply is specified by adding an "assoc_size" expression, as discussed in Appendix 9 Sections 9.3.1 and 9.3.2.3. The syntax for declaring a random associative array is depicted in FIG. 3.

Without any specification of constraints, the values that can be assigned to a random variable are simply limited by the range of values permissible for the variable's basic data type.

The values assigned to random variables are further controlled using "constraint blocks" as discussed in Section 9.3.3 of Appendix 9. Constraint blocks are put in the class definition after the variable declarations and before the methods as shown in FIG. 1. Adding constraint blocks to a class definition permits a class instance to make meaningful use of the "constraint_mode" method (discussed below). This method is added to all class definitions, whether they contain a constraint block definition or not, to ensure that the method perform properly within the various class hierarchies that may be formed. Each constraint block is given a name and is comprised of one or more expressions of type "constraint_expression." The basic syntax for defining a constraint block is shown in FIG. 5. Each constraint_expression limits the values which can be assigned to a random variable. A constraint_expression is always composed of: a left-hand-side (lhs) random variable, a relational operator (or relop) and a right-hand-side (rhs) expression. The syntax for a constraint expression is shown in FIG. 6. A constraint_expression limits the values assignable to its lhs random variable. The rhs expression of a constraint_expression defines a range or ranges of values, where a range is a continuous sequence of integer values bounded by, and including, a minimum and a maximum. The permissible values of the lhs variable are defined as being those values which bear the relation of relop with respect to the range or ranges of values defined by the rhs expression. The permissible relops include many standard operators, which are further defined in Section 3.6 of Appendix 9, as well as operators "in," "!in" and "dist" of distribution sets which are discussed in Section 9.3.3.1, Appendix 9.

Constraint blocks are initially active, meaning that they will act to constrain the random variables on the lhs of their constraint_expressions. Vera provides (as discussed in Section 9.3.3.3, Appendix 9) for the predefined method "constraint_mode" to activate or deactivate constraint blocks. The syntax for the invocation of constraint_mode is shown in FIG. 7.

Consider once again the handle to a class instance "<instance>." The method call "<instance>.constraint_mode (ON)" activates all of the instance's constraint blocks, while the method call "<instance>.constraint_mode(OFF)" deactivates all of the instance's constraint blocks. A particular constraint block can be activated or deactivated by including, after the ON/OFF parameter, the constraint block's name. Whether a particular constraint block is active or inactive can be determined, under program control, by the method call "<instance>.constraint_mode(REPORT, <constraint_block_name>)," where <constraint_block_name> represents the name of a particular constraint block whose status is to be queried. The REPORT feature of constraint_mode returns a value of either ON or OFF.

The rhs expression of a constraint_expression may include random variables. This introduces two major additional complications: cyclic dependencies between random variables, and a requirement that the non-cyclic assignment of values to certain random variables be done in a particular order. Even if logically consistent, Vera does not allow cyclic dependencies between random variables. Cycles could appear in two main ways: i) trivially where the same random variable appears on both the lhs and rhs of the same constraint_expression, or ii) where two or more constraint_expressions, that are ON simultaneously, define a cyclic dependency. As discussed in Section 9.3.3.6 of Appendix 9, the randomize method must sort the random variables before randomizing them to ensure that as each a random variable on the rhs of a constraint_expression has been assigned a value before it is utilized to constrain the lhs of the constraint_expression. As discussed below, the correct ordering for the non-cyclic assignment of values to random variables is maintained by a directed acyclic graph (or DAG).

Boundary is discussed in Section 9.3.4 of Appendix 9. Consider a handle to a class instance, which we shall refer to as <instance> (and which is also referred to in Appendix 9 as an "object_name"). The method call "<instance>.boundary (<FIRST/NEXT>)" causes the variables of that instance, with either a rand or randc attribute, as a group, to have a combination of boundary values assigned to each of them. The method call "<instance>.boundary(FIRST)" begins a boundary sequence by assigning an initial combination of boundary values to each random variable of <instance>. Each successive call to "<instance>.boundary(NEXT)" causes a successive and unique combination of boundary values to be assigned. Each call to "boundary" returns the value "OK," until the last unique combination of boundary values has been assigned. The call "<instance>.boundary(NEXT)" which causes the very last unique combination of boundary values to be assigned returns the value OK_LAST to indicate the completion of the boundary sequence. Once OK_LAST has been returned, additional calls of the form "<instance>.boundary(NEXT)" will return the value PAST_IT. Note that if <instance> has only one combination of boundary values, then the very first call of a boundary sequence, "<instance>.boundary(FIRST)," will return OK_LAST. Also, if an instance has no random variables, or all of its random variables are inactive, then "<instance>.boundary(FIRST)," will return NO_VARS.

3. Data Structures for Vera Instances

In order to further understand the detailed operation of the methods described above, a discussion of the data structures for Vera instances, upon which such methods operate, is presented in this section.

The following data structures are created as part of each new instance of a class. Certain of these data structures are also depicted in FIGS. 8 and 9.

A chain of records, each called a "HLevel_record" (standing for "hierarchy level record"), are created with one such record being created for each level of the class hierarchy. A listing of the contents of an HLevel_record is shown in FIG. 9. These are HLevel_records 800, 801 and 802 of FIG. 8. The chain of HLevel_records is pointed to by the instance's handles (an instance handle is basically a pointer, which points to an instance, and has certain information about the type of instance it is permitted to point to). An example instance handle 804 is shown. Handle 804 happens to point to the highest level of the instance's hierarchy. Other handles could point to other levels of the same object. The HLevel_record's are connected as a doubly linked list permitting movement between the levels of hierarchy of the instance. The base class is represented by the "first" or "highest level" HLevel_record in the list (such as HLevel_record 800), while the narrowest sub-class is represented by the "last" or "lowest level" HLevel_record (such as HLevel_record 802). The last HLevel_record is the lowest level record since it has the most ancestors from which to inherit variables and methods.

An HLevel_record contains the following (which are also depicted in FIG. 9):

(i) The variables (also known as properties) declared by the Vera language programmer as being part of the particular level of hierarchy represented by that HLevel_record. This includes variables that are handles to an instance of a programmer defined class, which were discussed above as being a sub-object. A sub-object is a declaration that another user-defined class (rather than a built-in primitive data type) be instantiated as a variable of a class definition. Sub-object variables differ from built-in data types in that when an instance incorporating sub-objects as a variable are created, only space for a pointers to the sub-objects are created. The programmer must provide for the creation of the sub-objects and the setting of the pointers to these sub-objects. Typically, the constructor of the instance incorporating sub-objects would be augmented with an appropriate invocation to all the constructors necessary to create all of its nested objects.

(ii) The number of random variables in HLevel_record is stored in a location called "num_rvars." A pointer, called "ptr_to_all_rvar_ptrs," points to an array of pointers. Each pointer in the array of pointers points to a unique random variable of the HLevel_record.

(iii) Each random variable of an HLevel_record has a flag, called "rand_flag," which indicates whether the random attribute of the variable is ON or OFF.

(iv) Additional information is stored for "randc" random variables. Each randc non-array random variable has a pointer to a table, called "rtable," which keeps track of the values which have already been generated for that random variable. Typically, rtable has 1 bit of storage associated with every possible value of the randc variable. As each value of the randc variable is generated, the fact that this value has been produced is "checked off" in rtable to insure that duplicate values are not generated. Since the Vera language currently permits randc variables to be only up to 8 bits in size, the largest rtable need only have 256 1-bit entries. Larger randc variables could be accommodated with correspondingly larger rtables. If the randc declaration is for an ordinary fixed-size array of randc random variables, an rtable is created for each such array element. If the randc variable is an associative (i.e., variable-sized) array, a flag "rand_assoc_array" is set to indicate that an rtable should be created for each element, later, when the number of elements is known.

(v) HLevel_record also contains the following storage locations in order to support constraint blocks. Each constraint block has its status, of being either "ON" or "OFF," stored in a "hidden variable" called "hidden_var." Each HLevel_record also contains a pointer (called "constraint_block_list") to a list of "constraint_block" records, where each constraint_block record represents either i) a constraint block which has been defined for the particular level of the class hierarchy represented by the HLevel_record, or ii) the associative arrays at the level of hierarchy represented by HLevel_record. An example constraint_block_list pointer 810 is shown in FIG. 8 pointing to a list of constraint_blocks 805 and 806.

(vi) HLevel_record contains a pointer, called "DAG," which points to the directed acyclic graph constructed for the instance to represent any dependencies among its random variables. There is only one such DAG per instance, and the DAG is pointed to only by the DAG pointer of the first, or highest level, HLevel_record.

Each "constraint_block" record contains the following fields which are shown in FIG. 10. "cons_block_name" contains the name of the constraint block represented by constraint_block. "hidden_var_ptr" is a pointer to the hidden variable in HLevel_record which stores the constraint block's ON or OFF status. "num_constraints" contains the number of constraint expressions in the constraint block represented by constraint_block. "cons_table_ptr" is a pointer to an array of "one_constraint" records, where each one_constraint record represents a unique constraint_expression within the constraint block represented by constraint_block. An example cons_table_ptr 811 is shown in FIG. 8 pointing to an array of one_constraint records 807, 808 and 809.

Each "one_constraint" record contains the following fields, which are also shown in FIG. 11. "lhs" is a pointer to the random variable, in an HLevel_record, on the left side of the constraint_expression represented by one_constraint. The random variable pointed to by lhs may be in the HLevel_record with which the one_constraint is directly associated, or in any of its ancestor HLevel_records. "relop" contains the operator which connects the lhs of the constraint_expression to the rhs of the constraint_expression. "num_rhs_vars" contains the number of random variables on the right hand side of the constraint_expression. "rhs_vars" is a pointer to an array of pointers, where each pointer in the array points to a random variable, in an HLevel_record, which is on the rhs of the constraint_expression represented by the one_constraint record. The random variables pointed to by the array of pointers may be in the HLevel_record with which one constraint is directly associated, or in any of its ancestor HLevel_records. "start_addr" contains the address for beginning execution of a Vera assembly language code block which evaluates the value of the rhs of the constraint_expression.

If the class hierarchy level represented by HLevel_record contains associative arrays, then the constraint_block and one_constraint records, as defined above in FIGS. 10 and 11, are set with values as defined, respectively, in FIGS. 12 and 13. The syntax for an associative array declaration is shown in FIG. 3.

There is only one constraint_block record for representing "assoc_size" expressions, per HLevel_record, regardless of whether there are one or more associative arrays are at the particular class hierarchy level represented by HLevel_record (there is no constraint_block record for representing assoc_size if there are zero associative arrays at a particular class hierarchy level). This constraint_block record is merely another record listed in the list of constraint_block records pointed to by the pointer constraint_block_list in HLevel_record. Preferably, this constraint_block is at the beginning of the list. The fields of the constraint_block for representing these associative arrays contain the following. "cons_block_name" contains "assoc_size." "hidden_var" is null since the assoc_size constraints are treated as always being ON. "num_constraints" contains the number of associative arrays in the HLevel_record. "cons_table_ptr" is a pointer to an array of "one_constraint" records, where each one_constraint record represents a unique associative array within the class hierarchy level represented by HLevel_record.

Each "one_constraint" record, when utilized to represent an associative array, contains the following. "lhs" is a pointer to the data storage in the appropriate HLevel_record for maintaining the entire associative array. "relop" contains "ASSOC_SIZE." "num_rhs_vars" contains the number of random variables in the expression on the rhs of "ASSOC_SIZE." "rhs_vars" is a pointer to an array of pointers, where each pointer in the array points to a random variable, in an HLevel_record, which is on the rhs of ASSOC_SIZE. The random variables pointed to by the array of pointers may be in the HLevel_record with which one constraint is directly associated, or in any of its ancestor HLevel_records. "start_addr" contains the address for beginning execution of a Vera assembly language code block which evaluates the value of the expression on the rhs of ASSOC_SIZE.

4. Randomize

The pseudo-code definition for the randomize method is shown in the following FIGS. 17A-17D, 18A-18D, 19A-19B, 20A-20B, 21A-21P. FIGS. 17A-17D present the randomize method itself, while FIGS. 18A-18D, 19A-19B, 20A-20B, 21A-21P present the support functions. The following discussion presents the execution of randomize, beginning with its initial invocation by the Vera language programmer with the construct "<instance>.randomize( )" Discussion of the pseudo-code below is sometimes followed by a specific cite to the Appendix, page and line numbers where it occurs.

The pseudo-code, of FIGS. 17A-17D, 18A-18D, 19A-19B, 20A-20B, 21A-21P, is loosely based on the C and C++ programming languages. The C and C++ programming languages are described in such texts as "A Book on C," by A. Kelley and I. Pohl, Benjamin Cummings Pub. Co., Third Edition, 1995, ISBN 0-8053-1677-9 and "The C++ Programming Language," by Bjarne Stroustrup, Addison-Wesley Pub. Co., 3rd edition, July 1997, ISBN 0-2018-8954-4, which are herein incorporated by reference. When dealing with a pointer to a structure, call it "some_pointer," a variable within the structure, call it "something_within," is referred to by "some_pointer→something_within." Alternatively, if some_pointer points to an instance, a variable or method within the instance (either of which we shall refer to as something_within) is also referred to by the same notation "some_pointer→something_within." If some_pointer is actually a handle to an instance, a variable or method within the instance is still referred to by the notation "some_pointer→something_within." Note that this notation is different from the notation used by the Vera language, which uses a dot symbol (".") rather than the arrow symbol ("→"). Thus in Vera language programming, if "some_handle" is a handle to some instance, and "something_within" is some variable or method within that instance, then the notation used is "some_handle.something_within."

Note that each method has a particular hierarchy level determined by the class it is a member of and the position of that class within a class hierarchy. Within a randomize method, "this" is understood to be a handle to the current instance to which randomize is being applied, and specifically it is a handle to the instance at a hierarchy level corresponding to the method's hierarchy level (see also Appendix 9, Section 8.7). Each HLevel_record represents a hierarchy level of an instance, with the whole sequence of HLevel_records, from first to last, representing the entire instance.

The initial invocation of randomize, by the Vera language programmer, which begins execution at FIG. 17A, line 1, has the parameter "do_it" set to its default value of "1." The randomize method called by this Vera language invocation is defined to be that of the instance's lowest level HLevel_record, regardless of the level of the HLevel_record pointed to by the handle to which randomize is applied. This is because randomize, at the Vera language level, is a "virtual method," as the term is understood generally in the OOP art and in the Vera language in particular. In effect, a virtual method translates a method call upon a handle to something other than the lowest hierarchy level into a method call upon a handle to the lowest hierarchy level at which a method with the same name exists. Since randomize exists for every class it therefore exists at every hierarchy level and therefore the method at the lowest hierarchy level is called.

Method calls within randomize itself, including those to randomize, are not virtual method calls. For these method calls, the method is called whose hierarchy level corresponds to the HLevel_record pointed to by the handle to which the method is applied. Besides randomize, the only other inherently virtual methods of the Vera language, for the task of stimulus generation, are: boundary, pack, unpack, rand_mode and constraint_mode. All of these stimulus functions are discussed at Chapter 9 (a "Chapter" is also referred to as a "Section" in this patent), Appendix 9.

Randomize's first subroutine call is a method call to pre_randomize at the lowest hierarchy level. FIG. 17B, line 11. The default pre_randomize method is a no-op, except for the fact that it performs a recursive calling of the pre_randomize methods defined at successively higher hierarchy levels, but this default operation can be overridden by the Vera language programmer to do any form of initialization which should be done automatically before random values are assigned.

Randomize then calls the procedure "build_dag" which creates a directed acyclic graph (DAG). FIG. 17B, line 29. Nodes of the DAG represent random variables of the instance, while edges represent the dependencies between random variables due to constraints. The DAG must be rebuilt each time randomize is called since the constraints and random variables which are ON may be changed dynamically under program control. Detailed pseudo-code describing the operation of build_dag is shown in FIG. 18. Note that within "build_dag" the pointer "curr_instance" refers to the current instance (at the default level) to which randomize is being applied. Since curr_instance is a copy of "this," from the calling randomize method, it is a handle to the instance at a hierarchy level corresponding to the calling randomize method's hierarchy level. This is also the case for curr_instance in FIGS. 19A-19B, 20A-20B, 21A-21P.

The "DAG" created by build_dag is actually a linked list of DAG node data structures, each such data structure called a "dag_node," with the head of the list of dag_nodes pointed to by the "DAG" pointer of the highest-level HLevel_record.

The structure of a dag_node is shown in FIG. 14. These various structures of dag_node will be explained in greater detail below in the course of presenting the pseudo-code for randomize. "rvar_pointer" points to the data storage, in the appropriate HLevel_record, for maintaining the value of the random variable represented by the dag_node. "do_randomize" is a flag which is set to indicate that the random variable, represented by the dag_node, should be assigned a random value. "relop_start_addr_list" is a pointer to a list of relop/start_addr pairs for each constraint expression which constrains the random variable represented by this dag_node. "set_constraint_field" points to a set_constraint data structure which represents the ranges of valid values from which a value for the random variable, represented by this dag_node, may be selected. The "curr_boundary_value_index" field is used by the "boundary" method call, also discussed below. The boundary values of the set_constraint_field may be viewed as a array. The "boundary" method sequentially uses the values of this array, and the "curr_boundary_value_index" field keeps track of boundary's state of progress through this array. The linked list of dag_nodes is kept with the pointers "next_dag_node" and "previous_dag_node." The edges of the DAG are formed by pointers between the dag_nodes, where these pointers are organized as follows. The "depends_on_list" of each dag_node X is a pointer that will be set to point to a linked list if the dag_node X depends on other dag_nodes. Each item of a linked list pointed to by depends_on_list is a data structure called a "depends_on_link." Each depends_on_link (besides having the next link pointer necessary for maintaining a linked list) contains a single pointer for pointing to another dag_node. Thus for each dag_node Y that a particular dag_node X depends on, there will be a depends_on_link, in the depends_on_list of dag_node X, with a pointer to dag_node Y. The higher the "ordering_number" of a dag_node, the greater the number of levels of the DAG (of which the dag_node is a part) which depend on the random variable represented by the dag_node. ordering_number is used, as described below, to achieve a linear ordering of the random variables according to which values are assigned.

The DAG of an instance is stored as a linear linked list of dag_nodes with additional depends_on_links, rather than solely as a DAG structure, for a variety of reasons. Firstly, there may be more than one DAG necessary to represent all of the dependencies between the random variables of an instance. As will become apparent from the procedures to follow, keeping all the DAGs on a single list is simpler than keeping track of each DAG separately. Secondly, the DAG or DAGs which represent the dependencies need to be linearized anyway (as discussed below) to provide an order in which to assign random values.

build_dag consists of a main loop (beginning at FIG. 18A, line 9) which iterates over each level of the instance's hierarchy, beginning with its highest level. Within this loop is another loop (beginning at FIG. 18A, line 14) which iterates over each constraint block defined for the particular hierarchy level of the instance. Suitable constraint blocks are then processed, for what they may add to the DAG, by calling "add_constraint_block_to_DAG." FIG. 18A, line 38. A constraint block is suitable if it is either for an associative array, or a constraint block which is ON and which is not overridden by a constraint block with the same name at a lower level in the class hierarchy. Thus constraint blocks which are not ON have no effect on constraining the values taken by random variables. Furthermore, constraint blocks which are ON can constrain random variables declared at their level in the hierarchy, or at any higher level of the hierarchy (they cannot constrain variables declared at a lower in the hierarchy since those variables, from the perspective of the constraint block, have not been declared yet). The effects of a constraint block can be completely eliminated by defining, at a lower level in the hierarchy, another constraint block with the same name.

add_constraint_block_to_DAG, whose definition begins at FIG. 18B, line 6, has a main loop which iterates over every one_constraint of the constraint block passed to it. Each such one_constraint, referred to as "cons," is processed by a call to "add_one_constraint_to_DAG." FIG. 18B, line 19.

add_one_constraint_to_DAG, whose definition begins at FIG. 18B, line 29, first checks to see whether the random variable referred to by the lhs of the one_constraint "cons" is already represented by a node in the DAG. If it is not, then such a DAG node is created. This node is referred to as "lhs_node." If lhs_node represents an associative array, then it represents the entire associative array as a symbolic unit rather than creating nodes for each individual element of the array. The reason for not creating a node for each individual element at this time is the fact that the "assoc_size" expression, which would determine the number of elements, may itself depend upon other random variables which have not been assigned values yet.

add_one_constraint_to_DAG then calls "add_to_DAG_node" to add the relop and start_addr of the one_constraint "cons" to the lhs_node. FIG. 18C, line 13. The relop and start_addr are represented by a single data structure which is put on the list, relop_start_addr_list, of lhs_node by add_to_DAG_node.

Next, add_one_constraint_to_DAG has a loop (beginning at FIG. 18C, line 20) which iterates over each random variable utilized in the rhs of one_constraint "cons." Note that the "*" operation of "*(cons→rhs_vars)" in the pseudo-code is a de-referencing operation which returns, in this case, the array of pointers to each random variable on the rhs of the one_constraint. Each such random variable is referred to as "rhs_rvar." If rhs_rvar is already represented by a node in the DAG, referred to as rhs_node, then checks must be made to determine whether the current one_constraint "cons" will introduce a cycle between lhs_node and rhs_node. As discussed above, no form of cyclic dependency between random variables is permitted in the Vera language. If is rhs_rvar is not already represented by a node in the DAG, then there is no need to check for a cyclic dependency. Whether rhs_node was already in the DAG or not, once the cyclic dependency issue has been eliminated, dependency of the lhs_node upon the rhs_node is added to the lhs_node (of type dag_node as discussed above) by giving its depends_on_list (made up of depends_on_links as discussed above) another depends_on_link which points to the rhs_node (also of type dag_node.) This addition of a depends_on_link is performed by "left_arg_depends_on_rt_arg" which is called in FIG. 18D, at lines 9 and 17. The definition for left_arg_depends_on_rt_arg begins at FIG. 18D, line 28.

The next step of the randomize method is the procedure "linearize_dag" (called at FIG. 17B, line 30) which reorders the linked list of DAG nodes according their dependencies. The list is ordered such that when each random variable is assigned a value, all random variables upon which it depends have already been assigned values. The pseudo-code for linearize_dag is shown in FIGS. 19A-19B, while its functionality is described as follows.

The DAG nodes are first given ordering_numbers by linearize_dag as follows. As a result of the following numbering procedure, the more levels of the DAG which depend upon a random variable, the higher its ordering_number will be. The first DAG node in the list is assigned the ordering_number 1. Any DAG nodes that it depends upon are located by following its depends_on_links. These DAG nodes are given the ordering_number 2. This tracing and numbering proceeds transitively. Therefore, for example, for each DAG node with ordering_number 2, the DAG nodes it depends on are located and given ordering_number 3. Once this transitive tracing and numbering has been completed, the next DAG node in the list, after the first DAG node, which has not yet been assigned an ordering_number, is located. This DAG node is given ordering_number 1 and tracing proceeds transitively through all DAG nodes it depends upon, as was done for the first DAG node in the list. If this tracing encounters a DAG node which has already been assigned an ordering_number, then if the ordering_number that would be assigned to the DAG node with the current tracing would be greater than the ordering_number already assigned to it, then the already-assigned DAG node is re-assigned the new higher ordering_number. Tracing and renumbering proceeds transitively, from the re-assigned node in a like manner. Alternatively, if the tracing encounters a DAG node with a previously-assigned ordering_number that is greater than the ordering_number which would be re-assigned to it, then the previously assigned ordering_number is kept and transitive tracing stops at that point. The algorithm proceeds with the basic two part cycle of moving forward through the list until it finds a DAG node not already assigned a ordering_number, and then assigning numbers through a transitive tracing, until it reaches the end of the list.

Once this numbering has been completed, linearize_dag then sorts the DAG nodes in order of decreasing ordering_number when proceeding from the front of the list to the end. Since each random variable is guaranteed to have a higher ordering_number than all of the random variables which depend on it, proceeding to assign values to the random variables of the instance's DAG, from the front of the DAG list to the back, ensures that when each random variable has its value assigned, the variables it depends on are already assigned values.

At this point in the execution of randomize, an ordered list of the DAG nodes has been produced for those random variables which: i) appear in a constraint block, and ii) appear in a constraint block which is ON. However, there may be random variables which: i) do not appear in any constraint block, or ii) have their randomness attribute turned OFF. The unconstrained variables need to be inserted in the list produced by linearize_dag in order that all random variables are assigned values. Unconstrained variables can be inserted at any point in the list since they depend upon no other random variables, however it is most efficient to insert them at the beginning of the list. Random variables whose randomness attribute has been turned OFF should not be assigned a value by randomize.

These operations are performed by "include_ON_rvars" of the randomize method. Detailed pseudo-code for include_ON_rvars is included in FIGS. 20A-20B.

include_ON_rvars begins by iterating (at FIG. 20A, line 8) over all the HLevel_records of the current instance (called "curr_instance"). At each hierarchy level of the instance, all the random variables are looped over. If the random variable is not an array, the function "ensure_in_DAG" is called to ensure that the variable, if its randomize attribute is ON, is both represented by a DAG node and that the DAG node has the value TRUE for a flag indicating that it should be assigned a random value (called the "do_randomize" flag). If the random variable is a non-associative array, then ensure_in_DAG is called for every element of the array. If the random variable is an associative array, then if its rand_flag is ON, ensure_in_DAG simply sets the do_randomize flag for the single DAG node representing the entire array as a symbolic unit. Later, during function "randomize_simple_member_vars," when the associative array is evaluated in the proper sequence with respect to the other random variables, the number of nodes indicated by its "assoc_size" expression is created.

The next step of the randomize method is to evaluate randomize_simple_member_vars. randomize_simple_member_vars iterates over every DAG node, with each such node being referred to as a "dnode." If a dnode does not symbolically represent an entire associative array, then it is processed by "evaluate_constraints" (FIG. 21B, line 16) and "set_random_value" (FIG. 21B, line 20). evaluate_constraints evaluates the constraints placed upon dnode in order to determine a set of valid ranges of values for dnode. set_random_value randomly selects a value for dnode from one of its ranges.

If dnode does symbolically represent an associative array, then the start_addr information stored on this node is for determining the assoc_size expression. This expression is evaluated to determine the size of the array for randomizing purposes. FIG. 21A, line 24. A node is created in the DAG for each element to be randomized if: i) this node is not already represented in the DAG list (FIG. 21A, lines 37-38), and ii) the randomize attribute of this array element has not been turned OFF (FIG. 21A, lines 39-40). Note that the rand_flag might be OFF at two levels: the flag for the entire array, or a flag for the individual element. The flag for an individual array element, if set, overrides the flag for the entire array. A rand_flag for an associative array element can have three values: OFF, ON or DEFAULT (meaning "use the whole-array flag").

evaluate_constraints (which begins at FIG. 21B, line 27) operates as follows. As stated above, the purpose of evaluate_constraints is to produce a set of valid ranges of values for the DAG node (dnode) passed to it. This set of valid ranges is represented by a "set_constraint" data structure, shown in FIG. 15. A set_constraint is an array of tuples, where each tuple represents a valid range. Each tuple contains the following parts: low_end (representing the low end of range), high_end (of the range), apportion_op (the apportionment operator for weight over the range), weight (for the range applied by apportion_op), sub_ranges (a pointer to a linked list of sub_ranges which the range may be split into) and num_values (which is the number of valid values in this range). Apportionment of weight is indicated by the Vera language operators ":=" or ":/," which are discussed in Section 9.3.3.1, Appendix 9. Apportionment operator ":=" means that the specified weight is given to each value of the range, while operator ":/" means that the specified weight is divided equally among all the values of the range.

If a dnode appears on the lhs of no constraints, evaluate_constraints will give it a single range whose low end is the value of type_min, and whose high end is the value of type_max. The apportionment operator will be ":=" assigning a weight of "1" to every value of the range. This "default" behavior of evaluate_constraints will be apparent from the discussion below. The values of type_min and type_max are defined at FIG. 21B, line 29 to page 3, line 6.

The main loop of evaluate_constraints begins at FIG. 21C, line 25 and ends at FIG. 21F, line 31. This loop iterates over the relop/start_addr pairs attached to dnode and is therefore directed to those DAG nodes which are constrained and have one or more relop/start_addr pairs attached. This loop begins by evaluating the Vera assembly code pointed to by the current value of start_addr with the Vera assembly code interpreter. FIG. 21C, lines 33-34. The result of this interpretation is left on the interpreter's stack and is pointed to by "rhs_constraint_current." If the one_constraint represented by this relop_start_addr pair contains a conditional which has returned a "void" value then this one_constraint should have no constraining effect and the loop skips to the next relop/start_addr pair. FIG. 21C, line 40. If the assembly code of the start_addr is associated with a relop of type "in," "!in" or "dist," then the result, left on the Vera assembly code interpreter's stack, will be a set_constraint type data structure. If the relop is "in" or "dist," then no further adjustment of this set_constraint is needed. If, however, the relop is "!in," then the ranges of set_constraint need to be inverted. FIG. 21D, line 22. The ranges of the set_constraint originally produced by the Vera assembly code interpreter, for "!in," state those ranges of values which the dnode random variable cannot have. Inversion of this means that the ranges state those values which can be taken by the random variable.

set_constraint_current is then set to rhs_constraint_current in order to save this set_constraint data structure for after the completion of this loop. If the relop is "in," "!in" or "dist," then the rest of this loop iteration is a no-op (since other relops are tested for). Since there should only be one relop of type "in," "!in" or "dist," per random variable, per instance, the value of set_constraint_current should not be further changed during this loop over relop/start_addr pairs attached to dnode.

If the relop is "<," "<=," ">" or ">=," then rhs_constraint_current will be a simple number. These constraints can cause an update to the Vera language programmer determined minimum or maximum for the random variable represented by dnode. These relops are handled by the pseudo-code at FIG. 21D, line 30 to FIG. 21E, line 13.

If the relop is "==," then dnode is being limited to just a single value. It is therefore logically inconsistent if there are two or more such constraints limiting the same random variable to two or more different values. FIG. 21E, lines 15-32.

A relop of "!=" limits dnode to not be of a particular value and these values are put on a list "ne_val." FIG. 21E, lines 34-40.

relop "=?=" limits dnode to be one of a particular set of numbers, and these numbers are put on the "aeq_val" list. FIG. 21E, line 42 to page 6, line 16.

relop "!?=" limits dnode to not be one of a particular set of numbers, and these numbers are put on the "ane_val" list. FIG. 21F, lines 18-29.

While looping over the relop/start_addr pairs for a dnode, a great many consistency checks are made. In general, these are done after evaluating each new relop/start_addr pair, in order to notify the user as soon as a problem has been detected.

One group of consistency checks deals with rhs values that are invalid for the type of constraint. For example, a rhs value that contained "x" or "z" bits would not be valid if the relop were "<," "<=," ">," ">=," "==" or "!=," since those relational operators require numbers to be meaningful constraints. Similarly, if the lhs is a bit variable, which cannot be negative, it would be an error if the relop were "<" or "<=" and the rhs were a value that would constrain the lhs to be negative. It would also be an error, for a lhs bit variable, if the relop (of type ">" or ">=") and the rhs value would constrain the lhs value to be a value larger than that type of variable could hold (e.g., lhs constrained to be ">9," but lhs a 3-bit variable).

Another group of consistency checks deals with cross-checking between constraints. For example, a constraint with the ">" operator is checked against "<," "<=," and "==" constraints. More specifically, for example, the constraints "lhs>6" and "lhs<4" constraints would conflict with each other. Another specific example of conflict would be between the constraints "lhs>6" and "lhs==3". Similarly, a constraint with the "==" operator is checked against constraints with the operators "<," "<=," ">," ">=." In addition, the "==" operator is checked against any previous constraint with the operator "==," "!=," "=?=," and "!?=." Some specific examples of conflicts which could arise between constraints with these operators are as follows: lhs==4 conflicts with lhs==6; lhs==4 conflicts with lhs !=4, and lhs==3' b001" conflicts with "lhs=?=3'b1xx." In a similar fashion, a constraint with the "=?=" operator is checked against other constraints with the following operators in order to detect possible conflicts: "==," "!=," "!?=" and "=?=."

Within a constraint with the operator "in", "!in", or "dist," there are consistency checks to ensure that the low value of a rhs range is less than or equal to the high value of that range, and that the weight is non-negative. A final check is made to see if the removal of disallowed values by range-splitting results in a situation where no allowed values at all remain in the set_constraint.

Once the loop over all relop/start_addr pairs has finished for dnode, a final determination of the set_constraint for this random variable must be made, based upon the various variables that were set in the course of the loop's iterations.

If no set_constraint was created in the loop ("set_constraint_current==NULL" at FIG. 21F, line 43), then a set_constraint structure is created at this point, utilizing the values, set by the loop, for user_min and user_max. In addition, the values of type_min and type_max may influence the range determined. If user_min was not specified or user_min<type_min, then type_min is used, else user_min is used. If user_max was not specified or user_max>type_max, type_max is used, else user_max is used. If a set_constraint has been created by the loop, then (FIG. 21G, lines 10-11) this pre-existing set_constraint is adjusted by the values of type_min, type_max, user_min and user_max.

Before testing for five additional possible adjustments to the set_constraint, an initial estimate of the number of valid values in each range of the set constraint is determined. FIG. 21G, lines 14-18.

The first additional set constraint adjustment depends upon whether eq_val has been set by the loop. FIG. 21G, lines 21-31.

The second possible set constraint adjustment depends upon whether dnode represents an enumerated type random variable. If it does, the appropriate "splits" of the ranges are performed. FIG. 21G, line 34 to FIG. 21I, line 10. A single range "split" is simply a division of a single range into two sub_ranges representing a gap, of invalid values, which existed in the previous single range representation. A "sub_range" is a data structure which has all the same fields as listed for a single range of a set_constraint as shown in FIG. 15, except that a sub_range does not include a pointer called "sub_ranges." The "sub_ranges" field of a set_constraint's range is a pointer to a linked list of such sub_range data structures.

The third, fourth and fifth possible adjustments to set_constraint_current are possible additional range splittings based upon, respectively, whether ne_val, ane_val or aeq_val have been set with one or more values. FIG. 21I, line 13 to FIG. 21J, line 21.

Once the range splittings have all been recorded, as a linked list of sub_range data structures for each range of set_constraint_current, the ranges of set_constraint_current are copied to a new_set_constraint data structure. This is handled, generally, by the pseudo-code at FIG. 21J, line 24 to FIG. 21M, line 7. If a range to be copied has sub_ranges: i) the information of each sub_range is copied to a new range of new_set_constraint; and ii) the weight of the range of set_constraint_current is distributed appropriately to the new corresponding ranges of new_set_constraint. If a range to be copied has no linked list of sub_ranges, then the range is simply copied to a new range of new_set_constraint.

evaluate_constraints returns with dnode being set to have its set_constraint_field point to the permissible ranges of values. FIG. 21M, line 7.

Following the application of evaluate_constraints to dnode, randomize_simple_member_vars applies set_random_value to dnode, whose definition begins at FIG. 21M, line 14.

If dnode has been limited to a single value by its constraint_expressions, then it's an easy matter for set_random_value to pick that single value for dnode. FIG. 21M, lines 17-23.

Otherwise, the selection of a random value is a two step process.

First, a range of dnode is randomly selected by the function "select_range." select_range is called at FIG. 21M, line 27, and it is defined beginning at FIG. 21O, line 21.

Secondly, a value is randomly chosen within the selected range. This is handled generally by the pseudo-code at FIG. 21M, line 29 to FIG. 21O, line 15.

If the set_constraint for dnode has only one range, then select_range has the easy task of just selecting that single range. FIG. 21O, lines 24-27. Otherwise, select_range selects a range in a process that is random, but which is also influenced by the apportioned weight to each range. The loop of select_range, which iterates over each range of dnode's set_constraint, calculates an array of subtotals, where there is one subtotal for each range. This loop is defined at FIG. 21O, line 29 to FIG. 21P, line 4. The difference in size between the subtotal for a range and the subtotal for the previous range determines the size of a "target" which must be "hit" for that range to be the range selected. If the range's apportionment operation is ":/", then the size of a range's target is determined from its weight, which was calculated to preserve its weight relative to the weights of the other ranges. If the apportionment operator is ":=", then the target size of a range is determined from both the weight for each value in the range (which is still calculated to preserve its weight relative to the weights of the other ranges) and the number of values in the range.

select_range returns the value of the index, in the set_constraint attached to dnode, for the range selected. FIG. 21P, line 17.

Returning to a discussion of set_random_value, at the point following the call to select_range, it picks a value at random, within the selected range, as follows. First, the number of individual values within the range (called "range_magnitude") is determined by subtracting the lowest value of the range from the highest value of the range and adding one. FIG. 21M, line 38. The following loop then happens only once, provided that dnode is not a randc random variable. Some random value (called "starter_rand_val") is generated. FIG. 21N, lines 7-8. starter_rand_val can be any size, as long as it is at least as big as range_magnitude. starter_rand_val is then reduced to a random value selected from the range zero to range_magnitude minus one by dividing starter_rand_val modulo the range_magnitude. FIG. 21N, lines 13-14. The result of this modulo divide is then added to the lowest value of the range in order to produce a random selection from within the range. FIG. 21N, lines 13-14.

The "while" loop of set_random_value (whose definition begins at FIG. 21M, line 42) may only iterate if a random value is to be generated for a randc variable. If the random value generated for actual_rand_val has already been generated for the randc variable, as determined by checking its rtable, then this "while" loop performs another iteration allowing for the generation of another random value. This handling of a randc variable is performed generally at FIG. 21N, line 21 to FIG. 21O, line 6. If the random value generated for actual_rand_val has already been generated for this randc variable, but every possible value has already been generated for this randc variable, then we are about to begin a new "cycle" of this random variable and actual_rand_val is selected. Also, if beginning a new cycle, the rtable must be completely reset, except for having the just generated value of actual_rand_val being checked off. Finally, if the value of actual_rand_val has not already been generated in this cycle for the randc variable, then it is used for setting dnode.

5. Constraint Mode

The pseudo-code definition for the constraint_mode method, as discussed above in Section 2 of this patent and depicted in FIG. 7, is presented in FIGS. 22A-22B.

The initial invocation of constraint_mode, at the Vera language level, which begins execution at FIG. 22A, line 1, has the parameter "flag" set to either REPORT, ON or OFF and has the parameter constraint_block_name set to either the name of a specified constraint block or NULL if none is specified. The constraint_mode method called by this Vera language invocation is defined to be that of the instance's lowest level HLevel_record, regardless of the level of the HLevel_record pointed to by the handle to which constraint_mode is applied. This is because constraint_mode, at the Vera language level, is a virtual method, as discussed above.

If the flag is of value REPORT, then the constraint_block must be specified or an error is generated. Assuming a constraint_block name is specified, then constraint_mode performs a loop through all the HLevel_records of the instance's hierarchy, beginning at the lowest level. Within this loop is another loop which iterates over each constraint block defined for the particular hierarchy level of the instance. As soon as a constraint_block is encountered with a cons_block_name that matches constraint_block_name, it's hidden_var value is returned as the value of constraint_mode. Note that if two constraint_blocks have the same cons_block_name, at different hierarchy levels of the same instance, then the hidden_var value of the lower-level constraint_block is returned as the reported value of constraint_mode.

If the flag is of value OFF or ON, then constraint_mode performs a loop through all the HLevel_records of the instance's hierarchy, beginning at the lowest level. Within this loop is another loop which iterates over each constraint block defined for the particular hierarchy level of the instance. For every constraint_block encountered in an instance with a cons_block_name that matches constraint_block_name, it's hidden_var value is set to the value of flag. Alternatively, if no constraint_block_name is specified, then the hidden_var of every constraint_block, other than those which represent associative array sizes, is set to the value of flag.

6. Boundary

The pseudo-code definition for the boundary method is shown in FIGS. 23A-23J and 24A-24R. FIGS. 23A-23J present the boundary method itself, while FIGS. 24A-24R present the support functions. The following discussion presents the execution of boundary, beginning with its initial invocation by the Vera language programmer with the construct "<instance>.boundary(<FIRST/NEXT>)." Discussion of the pseudo-code below is sometimes followed by a specific cite to the Appendix, page and line numbers where it occurs.

The pseudo-code, of FIGS. 23A-23J and 24A-24R, is loosely based on the C and C++ programming languages, as was the pseudo-code of FIGS. 17A-17D, 18A-18D, 19A-19B, 20A-20B, 21A-21P, 22A-22B.

On any call to "boundary," the pre_boundary method is performed at the beginning (FIG. 23B, line 39) and the post_boundary method is performed at the end (FIG. 23C, line 39 and FIG. 23J, line 7).

Before further explaining the operation of the "boundary" method, it is important to understand how boundary breaks up the random variables of the instance into three main types: i) built-in Vera data types, with the "rand" or "randc" attribute, in all HLevel_records of the instance to which boundary is being applied; ii) "rand" sub-objects (note that sub-objects cannot be "randc") in all HLevel_records of the instance, above the current level HLevel_record (for the initial lowest-level boundary method, the "current level" HLevel_record is the lowest level record of the entire instance, and therefore this type comprises all HLevel_records of the instance that are above the lowest-level HLevel_record); and iii) "rand" sub-objects of the current level HLevel_record. rand sub-objects of the current level HLevel_record may be further divided into two sub-types: a) individual rand sub-objects (that are not array elements) and b) arrays (either associative or regular) of rand sub-objects.

Random variables of type (i) are identified, in the code for boundary, by the variable "curr_turn" having the value 0. Random sub-objects of type (ii) are identified by the variable "curr_turn" having the value 1. Random sub-objects of type (iii) are identified by values of curr_turn being 2 or greater. (For simplicity of explaining how curr_turn values are assigned to sub-objects of type (iii), the following explanation assumes the instance contains all random sub-objects of type (iii) and sub-type (a), followed by all random sub-objects of type (iii) and sub-type (b). In practice, sub-objects of these two sub-types can be intermingled.) If an instance has N random sub-objects of type (iii) and of sub-type (a), these are identified with the following curr_turn values: 2, 3, 4, . . . (2+(N−1)). If an instance has X arrays of random sub-objects (sub-type (b)), then each element of each of these X arrays has its own unique curr_turn value. The curr_turn values for identifying array elements begin with (2+(N−1))+1 and continue successively. Any item referred to by a curr_turn value, for purposes of being assigned a combination of boundary values to its random variables, will generically be referred to as a "turn item."

The overall operation of "boundary," in terms of curr_turn, is as follows when called with sequence=FIRST.

The variable "curr_turn" is set depending upon whether this is a Vera-language programmer invocation of boundary, meaning that do_it is equal to 1 and the built-in Vera data types are assigned boundary values, or if this is a "super.boundary" call, to the HLevel_records above the lowest level HLevel_record where processing is concerned only with the sub-objects. FIG. 23C, lines 17-33.

A "while" loop is then started which successively increments curr_turn. FIG. 23D, line 10. This "while" will be described from the perspective of starting with curr_turn=0. If the loop starts with curr_turn=1, the operation will be the same except that the iteration with curr_turn=0 is skipped. As will be understood from the above discussion of turn items, in the first iteration of the "while," since curr_turn=0, random variables of type (i) are assigned boundary values. FIG. 23D, line 19 to FIG. 23E, line 15. In the second iteration random sub-objects of type (ii) are processed since curr_turn=1. FIG. 23E, lines 18-38. If the instance contains random sub-objects of type (iii) and of sub-type (a), the first of these are processed in the third iteration where curr_turn=2. FIG. 23E, line 41 to FIG. 23F, line 31. Once N iterations have occurred, to process all N sub-objects of type (iii) and of sub-type (a), then iterations are commenced for assigning boundary values to each sub-object which is an element of an array. FIG. 23F, line 35 to FIG. 23G, line 33. After processing the last element of the last array, curr_turn is detected as having "fallen off the end" of the items to be assigned boundary values and the "while" loop is exited because curr_turn is no longer less than past_the_last_turn. FIG. 23D, line 10. Note that for each of these FORWARD iterations, since boundary_simple_member_vars is being called with its "sequence" parameter equal to FIRST, each turn item is reset, from any state it may have been left in from a previous boundary sequence, before the first boundary combination of the current sequence is generated.

Each time the boundarizing section is completed for a "while" iteration, past_the_last_turn is updated with the value of dynamic_turn_count. FIG. 23G, lines 36-40. Once the entire "while" is completed, past_the_last_turn can be set to its accurate value, taking into account the size of any associative arrays (of sub-objects). FIG. 23I, lines 4-6. past_the_last_turn can change in value, as a result of different calls to boundary which are part of the same boundary sequence, due to changes in the size of associative arrays. Associative arrays can change their size if their "assoc_size" expressions have random variables.

When called with sequence=NEXT, the overall operation of "boundary" is as follows.

The operation of "boundary" begins with past_the_last_turn, completed_turn, curr_turn and first_turn still being set to the values determined by a previous call to boundary, that previous call be a FIRST or a NEXT.

First, a check is done to see whether all possible boundary combinations have already been assigned, in which case PAST_IT is returned as the value of "boundary." FIG. 23C, lines 36-40. This is indicated by "completed_turn" which begins a particular sequence of boundary calls by having a value of −1 and is therefore not "pointing" to any of the random variables or random sub-objects as having been fully utilized in boundary combination with other random variables or random sub-objects. Once all the combinations of the random variables of type (i), except for the last such combination, have been utilized in combination with all the possible combinations of all the other random sub-objects of type (ii) or (iii) and the random variables of type (i) have just been set to their last boundary combination, then completed_turn is set to 0 meaning that completed_turn "points" to random variables of type (i) as requiring the generation of no further boundary combinations. completed_turn is, likewise, successively incremented as the random sub-objects of types (ii) and (iii) are utilized in combination with all the possible combinations of all the other random sub-objects.

Assuming that the previous call to "boundary" terminated normally, curr_turn should be equal to "past_the_last_turn" from the previous "boundary" call. Therefore, curr_turn will be decremented to point to the very last turn item which was assigned a combination of boundary values on the previous "boundary" call. FIG. 23D, lines 1-6.

The "while" loop is then executed. Appendix 7, page 4, line 10. Since curr_turn is pointing to the very last "turn" to be randomized, only the last turn item has a new combination of boundary values assigned to its random variables.

It is important to note that the various sections within the "while," responsible for assigning boundary values, are activated by having the test "curr_turn==dynamic_turn_count"

return TRUE. Each of these sections will be referred to as a "boundarizing section." The first boundarizing section tests for both curr_turn and dynamic_turn_count being zero. FIG. 23D, line 19 to FIG. 23E, line 15. The second boundarizing section tests for both curr_turn and dynamic_turn_count being one. FIG. 23E, lines 18-38. The second boundarizing section is code which is only generated by the Vera compiler if the particular class, which this boundary method is associated with, has a super-class. In general, the boundary method generated by the Vera compiler for a particular class depends on the sub-object member variables of that class (specifically those which are of a random type) and on whether the class has a super class. The third boundarizing section actually consists of N almost identical boundarizing sections (generated by the Vera compiler) with one such section for each non-array sub-object of the current level HLevel_record (as mentioned above, the "current level" is the lowest-level HLevel_record for the initial call to the lowest-level boundary method). FIG. 23E, line 41 to FIG. 23F, line 31. The first of these N sections would test for curr_turn and dynamic_turn_count both being of value two. The fourth boundarizing section is very similar to the third boundarizing section in that it actually consists of one such section for each array of random sub-objects of the current level HLevel_record. The fourth boundarizing section works differently from the other boundarizing sections in that rather than testing for curr_turn being equal to dynamic_turn_count, it generates an index for each element of each such random array (for each "while" iteration) by subtracting dynamic_turn_count from curr_turn. FIG. 23F, line 35 to FIG. 23G, line 33.

If all boundary values of the last turn item have already been used, the "success" variable will be set to PAST_IT after the boundarizing section, of a "while" iteration, for the last sub-object has been completed. This means that the "direction" of the "while," for the next iteration, is REVERSE. FIG. 23H, lines 15-17. It also means that curr_turn is decremented such that it points to the next earlier turn item. FIG. 23H, line 40. If all boundary values of the next to last turn item have also already been used, "success" will once again be set to PAST_IT at the end of the loop and the "direction" of the "while," for the next iteration, will once again be REVERSE. FIG. 23H, lines 15-18. Finally, the "while" loop will have backed-up sufficiently to reach a turn item which does not return PAST_IT. This implies that success is one of: OK, OK_LAST, FAIL or NO_VARS. In any one of these cases, the "direction" of the "while," for the next iteration, will be FORWARD. FIG. 23H, line 24. If OK_LAST is the value returned by the non PAST_IT turn item, then a check is made to determine whether "competed_turn" should be advanced to point to this turn item. FIG. 23H, lines 27-33. Having the direction set to FORWARD means also that curr_turn is incremented. FIG. 23H, line 38. On the next FORWARD iteration, each turn item is reset to its initial state and a first boundary combination for it is generated. The "while" continues to iterate in a forward fashion, just as it did for a "sequence" of FIRST, until curr_turn once again "falls off" the last turn item.

boundary_simple_member_vars, shown in FIGS. 24A-24R, sets the random variables, represented by the curr_instance passed to it, to a combination of boundary values according to the "sequence" parameter and according to curr_instance's current state. The operation of boundary_simple_member_vars will first be discussed with the "sequence" parameter set to FIRST, and then with the "sequence" parameter set to NEXT.

When called with the "sequence" parameter set to FIRST, "curr_dnode" is set to point to the first DAG node of curr_instance and the "direction" variable is set to FORWARD. FIG. 24B, lines 7-8. "completed_dnode" is set to point to either NULL, or to the last DAG node, from the beginning of the DAG node list, which is representative of a whole array (since nodes which represent a whole array do not have boundary values in themselves, only their constituent elements do). FIG. 24B, lines 10-18. "last_dnode" is set to point to the last DAG node of curr_instance. FIG. 24B, lines 20-22.

With the "sequence" parameter set to FIRST, the next statement to be executed is the "while" loop which begins on FIG. 24C, line 10 and ends at FIG. 24E, line 34. Since curr_dnode is not equal to NULL and success not equal to FAIL, at least a first iteration of the "while" loop will occur. Since "node_sequence" is equal to FIRST, the first "if" within the "while" loop is executed. FIG. 24C, line 14. If curr_dnode points to a DAG node representing an entire associative array, then the necessary DAG nodes to represent its elements are created and/or flagged by "modify_assoc_array." FIG. 24C, lines 23-42. The pseudo-code for "modify_assoc_array is also given in FIG. 24Q, line 13 to FIG. 24R, line 31. If curr_dnode does not point to a DAG node representing an entire associative array, then any state being held for this random variable, for a previous boundary-generated sequence, is "cleaned" up by being reset. FIG. 24C, line 43 to FIG. 24D, line 33. In addition, a "set_constraint" data structure is determined for curr_dnode by "evaluate_constraints_for_boundary." Then a first boundary value from the set_constraint for curr_dnode is used to set the value of the random variable represented by curr_dnode. This setting of curr_dnode's random variable is accomplished by "set_boundary_value." evaluate_constraints_for_boundary is given in FIG. 24F, line 14 to FIG. 24O, line 23. set_boundary_value is given in FIG. 24O, line 26 to FIG. 24Q, line 10. Since "set_boundary_value" will set "success" to either OK, OK_LAST, or FAIL (if there is an inconsistency among the constraints), the next actions of the "while" loop will be to set "direction" to FORWARD and "node_sequence" to FIRST. FIG. 24E, lines 23-24. Next, a check is done to determine whether curr_dnode should be completed_dnode. FIG. 24E, lines 30-32. This is possible at this point in the execution of boundary_simple_member_vars if curr_dnode has only one boundary value in its set_constraint. Since "direction" has been set to FORWARD, curr_dnode is set to move forward to be the next DAG node of list for curr_instance.

As can be seen, the "while" loop will continue to iterate, as part of the FIRST call to boundary_simple_member_vars, as follows. The "while" loop will continue to iterate forward through the DAG node list of curr_instance until curr_node has pointed to every node on the DAG list. Once curr_node has pointed to the last DAG node, "while" ends by having curr_node be NULL. For every DAG node so pointed to, it is either "expanded" into its constituent elements if an associative array, or its constraints are evaluated in order to produce its set_constraint of boundary values. If a set_constraint is produced for the DAG node, then the first boundary value of its set_constraint is assigned to its random variable by "set_boundary_value" which will return either OK or OK_LAST. Since "success" will never equal PAST_IT in this FIRST call to boundary_simple_member_vars, the "while" loop continues to iterate forward through the DAG nodes. If there is a continuous sequence of one or more DAG nodes, starting from the first node, which have only one boundary value each, then completed_dnode will end up pointing to the last DAG node of the sequence when "while" ends.

The operation of boundary_simple_member_vars will now be discussed with the "sequence" parameter set to NEXT. First, a check is done to determine whether all combinations of boundary values have already been generated by boundary_simple_member_vars. FIG. 24B, lines 30-36. Otherwise, provided that curr_dnode has not been left pointing to something other than NULL from a previous call to boundary_simple_member_vars, curr_dnode is set to point to the last DAG node of curr_instance and "direction" is set to REVERSE. FIG. 24C, lines 7-8. The "while" loop is then begun and, if curr_dnode does not point to a node representing an entire associative array, the next available boundary value of curr_dnode is assigned to the random variable it represents by set_boundary_value. FIG. 24D, line 37-FIG. 24E, line 4. If the last boundary value has already been utilized for curr_dnode, then set_boundary_value will return PAST_IT and "direction" will be set to REVERSE. FIG. 24E, lines 11-15. This will cause curr_dnode to point to the DAG node preceding the current value of curr_dnode (FIG. 24E, line 38) and the "while" loop will perform another iteration. In general, "while" will continue to so iterate, and back up the DAG list, each time it encounters a DAG node for which all boundary values have already been assigned. If this backing up results in finding a DAG node for which not all boundary values have been assigned, then set_boundary_value will not return PAST_IT and therefore "direction" will be set to FORWARD and node_sequence to FIRST. FIG. 24E, lines 23-24. In addition, a test is made to determine whether curr_dnode should be completed_dnode. FIG. 24E, lines 30-32. Finally, this iteration of "while" will move curr_dnode forward to the next DAG node in curr_instance's list. Since node_sequence has been set to FIRST, the behavior of "while" will be the same as discussed above for when boundary_simple_member_vars is called with "sequence" being FIRST. "while" will continue to iterate forward until curr_dnode is once again set to NULL. For each DAG node iterated over, its set_constraint will be determined anew (since it depends on other "more significant" random variables whose values have changed) and a first boundary value selected from that new set_constraint. FIG. 24C, line 43 to FIG. 24D, line 32.

It is worth noting that after every invocation of boundary_simple_member_vars, curr_dnode should be left pointing to NULL (NULL being the "node" after last_dnode). This is because every invocation of boundary_simple_member_vars ends up by iterating forward towards the end of the DAG node list, unless some error occurs in evaluating the set_constraint of a DAG node which would shortcut the "while" loop.

evaluate_constraints_for_boundary is very similar to evaluate_constraints for randomize, which was discussed above in detail. The two main differences are discussed in the introductory comments of evaluate_constraints_for_boundary. FIG. 24F, lines 14-20. Similarly, for a description of set_boundary_value see the introductory comments of FIG. 24O, lines 26-28, and for a description of modify_assoc_array see the introductory comments of FIG. 24Q, lines 13-22.

7. Hardware Environment

Figure 16:
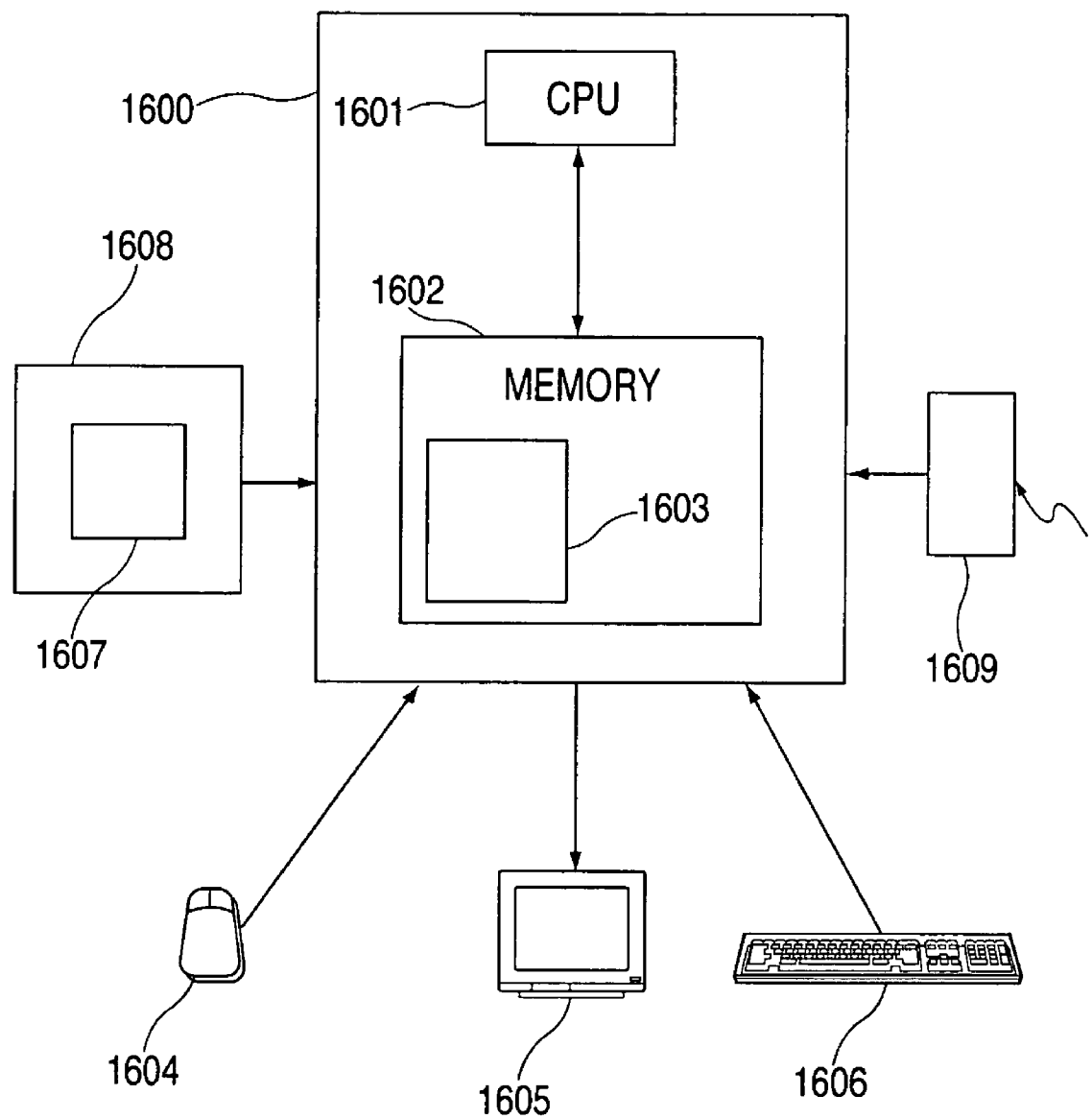
FIG. 16 shows a computing hardware environment within which to operate the present invention.

Typically, the timing analysis architecture of the present invention is executed within the computing environment (or data processing system) such as that of FIG. 16. FIG. 16 depicts a workstation computer 1600 comprising a Central Processing Unit (CPU) 1601 (or other appropriate processor or processors) and a memory 1602. Memory 1602 has a portion of its memory in which is stored the software tools and data of the present invention. While memory 1603 is depicted as a single region, those of ordinary skill in the art will appreciate that, in fact, such software may be distributed over several memory regions or several computers. Furthermore, depending upon the computer's memory organization (such as virtual memory), memory 1602 may comprise several types of memory (including cache, random access memory, hard disk and networked file server). Computer 1600 is typically equipped with a display monitor 1605, a mouse pointing device 1604 and a keyboard 1606 to provide interactivity between the software of the present invention and the chip designer. Computer 1600 also includes a way of reading computer readable instructions from a computer readable medium 1607, via a medium reader 1608, into the memory 1602. Computer 1600 also includes a way of reading computer readable instructions via the Internet (or other network) through network interface 1609.

While the invention has been described in conjunction with specific embodiments, it is evident that many alternatives, modifications and variations will be apparent to those skilled in the art in light of the foregoing description. Accordingly, it is intended to embrace all such alternatives, modifications and is variations as fall within the spirit and scope of the appended claims and equivalents.

What is claimed is:

1. A method for generating values in a data processing system, comprising:
   generating a graph data structure, representing at least a first dependency relation, determined by at least a first relational operator between at least a first and a second value generator;
   generating a linear ordering, from the graph data structure, such that the first value generator is ordered before the second value generator if the second value generator, according to the first dependency relation, depends upon a first value generated by the first value generator;
   generating a first data structure, containing at least a first range of values, wherein any value of the first range can be used to satisfy the first relational operator;
   assigning a first value, for use as test data, to the first value generator that is a boundary value of the first data structure;
   generating a second data structure, containing at least a second range of values, wherein any value of the second range can be used to satisfy the first relational operator; and
   assigning a second value, for use as test data, to the second value generator that is a boundary value of the second data structure and that, in conjunction with the first value, satisfies the first relational operator.

2. The method of claim 1, wherein the graph data structure is a directed acyclic graph.

3. The method of claim 1, wherein the first value generator is constrained by at least a first constraint data structure and the second value generator is constrained by at least a second constraint data structure.

4. The method of claim 3, wherein the second constraint data structure depends on the first constraint data structure.

5. The method of claim 1, wherein the step of generating a first valid-values data structure comprises,
   traversing at least a first constraint data structure associated with the first value generator; and
   generating at least a range of valid values for the first value generator satisfying at least the first constraint data structure.

6. A computer program product comprising:
   a computer usable medium having computer readable code embodied therein for causing generation of values, the computer program product including:
   computer readable program code devices configured to cause a computer to effect generating a graph data structure, representing at least a first dependency relation, determined by at least a first relational operator between at least a first and a second value generator;

computer readable program code devices configured to cause a computer to effect generating a linear ordering, from the graph data structure, such that the first value generator is ordered before the second value generator if the second value generator, according to the first dependency relation, depends upon a first value generated by the first value generator;

computer readable program code devices configured to cause a computer to effect generating a first data structure, containing at least a first range of values, wherein any value of the first range can be used to satisfy the first relational operator;

computer readable program code devices configured to cause a computer to effect assigning a first value, for use as test data, to the first value generator that is a boundary value of the first data structure;

computer readable program code devices configured to cause a computer to effect generating a second data structure, containing at least a second range of values, wherein any value of the second range can be used to satisfy the first relational operator; and computer readable program code devices configured to cause a computer to effect assigning a second value, for use as test data, to the second value generator that is a boundary value of the second data structure and that, in conjunction with the first value, satisfies the first relational operator.

7. A data processing system for generating values, comprising:

a subsystem for generating a graph data structure, representing at least a first dependency relation, determined by at least a first relational operator between at least a first and a second value generator;

a subsystem for generating a linear ordering, from the graph data structure, such that the first value generator is ordered before the second value generator if the second value generator, according to the first dependency relation, depends upon a first value generated by the first value generator;

a subsystem for generating a first data structure, containing at least a first range of values, wherein any value of the first range can be used to satisfy the first relational operator;

a subsystem for assigning a first value, for use as test data, to the first value generator that is a boundary value of the first data structure;

a subsystem for generating a second data structure, containing at least a second range of values, wherein any value of the second range can be used to satisfy the first relational operator; and a subsystem for assigning a second value, for use as test data, to the second value generator that is a boundary value of the second data structure and that, in conjunction with the first value, satisfies the first relational operator.

* * * * *